United States Patent [19]
Jewell

[11] Patent Number: 5,877,519
[45] Date of Patent: Mar. 2, 1999

[54] EXTENDED WAVELENGTH OPTO-ELECTRONIC DEVICES

[75] Inventor: Jack L. Jewell, Boulder, Colo.

[73] Assignee: Picolight Incoporated, Boulder, Colo.

[21] Appl. No.: 824,779

[22] Filed: Mar. 26, 1997

[51] Int. Cl.$^6$ .................. H01L 31/0328; H01L 33/00
[52] U.S. Cl. ............................ 257/190; 257/191
[58] Field of Search .................... 257/190, 191

[56] References Cited

U.S. PATENT DOCUMENTS

| | | | |
|---|---|---|---|
| 4,558,336 | 12/1985 | Chang et al. | 257/190 |
| 4,806,996 | 2/1989 | Luryi | 257/190 |
| 4,963,949 | 10/1990 | Wanlass et al. | 257/190 |
| 5,019,874 | 5/1991 | Inoue et al. | 257/190 |
| 5,032,893 | 7/1991 | Fitzgerald, Jr. et al. | 257/627 |
| 5,091,767 | 2/1992 | Bean et al. | 257/190 |
| 5,156,995 | 10/1992 | Fitzgerald, Jr. et al. | 438/494 |
| 5,294,808 | 3/1994 | Lo | 257/17 |
| 5,448,084 | 9/1995 | Hoke et al. | 257/190 |
| 5,512,375 | 4/1996 | Green et al. | 428/426 |
| 5,621,227 | 4/1997 | Joshi | 257/190 |
| 5,633,516 | 5/1997 | Mishima et al. | 257/190 |

FOREIGN PATENT DOCUMENTS 2215514  9/1989  United Kingdom .

OTHER PUBLICATIONS

Koyama et al., "Wavelength Control of Vertical Cavity Surface–Emitting Lasers by Using Nonplanar MOCVD," *IEEE Photonics Technology Letters*, vol. 7 (Jan. 1995), pp. 10–12.

Fang & Morkoc, "Lattice–Mismatched Heteroepitaxy," *Integrated Optoelectronics*, Academic Press, San Diego, Dagenais, Leheny and Crow, Eds (1995), pp. 170–173.

Bhat, "Organometallic Chemical Vapor Deposition," *Integrated Optoelectronics*, Academic Press, San Diego, Dagenais, Leheny and Crow, Eds (1995), pp. 121–144.

Kohama et al., "0.85$\mu$m Bottom–Emitting Vertical–Cavity Surface–Emitting Laser Diode Arrays Grown on AlGaAs Substrates," *Electronics Letters*, vol. 30 (Aug. 1994), pp. 1406–1407.

Ishikawa et al., "Analysis of Temperature Dependent Optical Gain of Strained Quantum Well Taking Account of Carriers in the SCH Layer," *IEEE Photonics Technology Letters*, vol. 6 (Mar. 1994), pp. 344–347.

(List continued on next page.)

*Primary Examiner*—Jerome Jackson
*Assistant Examiner*—John Guay
*Attorney, Agent, or Firm*—Jagtiani & Associates

[57] ABSTRACT

An improved semiconductor device is provided. The semiconductor device comprises a first layer on a restricted growth surface having a first central region with a transverse dimension D and having a first average lattice constant $L_1$ within the first central region; a first, last and at least one intermediate transition layers, the transition layers forming a transition region, the transition region disposed above the first layer, the transition region having a vertical thickness T, and where at least one of the intermediate transition layers has average lattice constants between $L_1$ and a second average lattice constant $L_c$ where the first transition layer has a lattice constant closer to the $L_1$ than $L_c$ and the last transition layer has a lattice constant closer to the $L_c$ than $L_1$; and a second layer disposed on the transition region, the second layer having a second average lattice constant $L_2$, the second layer having a second central region having the average lattice constant $L_c$ and an average lattice constant $L_3$ outside of the second central region, and where $L_c$ does not equal $L_3$; wherein: the transition region has an average fractional change in lattice constant characterized by $\kappa$ where $\kappa = (D/T)\{(L_c-L_1)/L_1\}$, where $|\kappa|<18$ and wherein a lattice mismatch $|L_c-L_1|/L_1 \geq 0.0014$. Additionally, various preferred semiconductor substrates, transition regions and active regions are discussed.

39 Claims, 9 Drawing Sheets

OTHER PUBLICATIONS

Shoji et al., "Fabrication of $In_{0.25}Ga_{0.75}$ As/InGaAsP Strained SQW Lasers on $In_{0.05}Ga_{0.95}As$ Ternary Substrate," *IEEE Photonics Technology Letters,* vol. 6 (Oct. 1994), pp. 1170–1172.

Coleman, James, *Quantum Well Lasers,* Academic Press, London, (1993) pp. 372–413.

Ishikawa, "Theoretical Gain of Strained Quantum Well Grown on an InGaAs Ternary Substrate," *Applied Physics Letters,* vol. 63 (Aug. 1993), pp. 712–714.

Chin et al., "Gas–Source Molecular Beam Epitaxial Growth, Characterization, and Light–Emitting Diode Application of $In_xGa_{1-x}P$ on GaP(100)," *Applied Physics Letters,* vol. 62 (May 1993), pp. 2369–2371.

Chin et al., "Heteroepitaxial Growth of InP/$In_{0.52}$ $Ga_{0.48}As$ Structures on GaAs (100) by Gas–Source Molecular Beam Epitaxy," *Applied Physics Letters,* vol. 62 (May 1993), pp. 2708–2710.

LeGoues et al., "Mechanism and Conditions or Anomalous Strain Relaxation In Graded Thin Films an Superlattices," *Journal of Applied Physics,* vol. 71 (May 1992), pp. 4230–4243.

Chang et al., "Strain Relaxation of Compositionally Graded InXGa1–XAs Buffer Layers for Modulation–Doped $In_{0.3}Ga_{0.7}As/In_{0.29}Al_{0.71}As$ Heterostructures," *Applied Physics Letters,* vol. 60 (Mar. 1992), pp. 1129–1131.

Fitzgerald et al., "Totally Relaxed $Ge_xSi_{1-x}$ Layers with Low Threading Dislocation Densities Grown on Si Substrates" *Applied Physics Letters,* vol. 59 (Aug. 1991), pp. 811–814.

Stinson et al., "High–Efficiency InGaP Light–Emitting Diodes on GaP Substrates," *Applied Physics Letters,* vol. 58 (May 1991), pp. 2012–2014.

Zou et al., "Photoluminescence Study of Critical Thickness of Pseudomorphic Quantum Wells Grown on Small Area Mesa Stripes," *Applied Physics Letters,* vol. 58 (Feb. 1991), pp. 717–719.

Chand et al., "Elimination of Dark Line Defects in GaAs–on–Si by Post–Growth Patterning and Thermal Annealing," *Applied Physics Letters,* vol. 58 (Jan. 1991), pp. 74–76.

Guha et al., "Defect Reduction in Strained $In_xGa_{1-x}AS$ Via Growth on GaAs (100) Substrates Patterned to Submicron Dimensions," *Applied Physics Letters,* vol. 56 (Jun. 1990), pp. 2304–2306.

Ribas et al., "Device Quality $In_{0.4}$ $Ga_{0.6}As$ Grown on GaAs by Molecular Beam Epitaxy," *Applied Physics Letters,* vol. 57 (Sep. 1990), pp. 1040–1042.

Madhukar et al., "Realization of Low Defect Density, Ultrathick, Strained InGaAs/GaAs Multiple Quantum Well Structures Via Growth on Patterned GaAs (100) Substrates," *Applied Physics Letters,* vol. 57 (Nov. 1990), pp. 2007–2009.

Omura et al., "Low Threshold Current 1.3$\mu$m GaInAsP Lasers Grown on GaAs Substrates," *Electronics Letters,* vol. 25 (Dec. 1989), pp. 1718–1719.

Melman et al., "InGaAs/GaAs Strained Quantum Wells with a 1.3$\mu$mBand Edge at Room Temperature," *Applied Physics Letters,* vol. 55 (Oct. 1989), pp. 1436–1438.

Vawter et al., "Useful Design Relationships for the Engineering of Thermodynamically Stable Strained–Layer Structures," *Journal of Applied Physics,* vol. 65 (1989), pp. 4769–4773.

Yacobi et al., "Stress Variations and Relief in Patterned GaAs Grown on Mismatched Substrates," *Applied Physics Lettes,* vol. 52 (Feb. 1988), pp. 555–557.

Fitzgerald et al., "Elimination of Interface Defects in Mismatched Epilayers by a Reduction in Growth Area," *Applied Physics Letters,* vol. 52 (May 1988), pp. 1496–1498.

Luryi et al., "New Approach to the High Quality Epitaxial Growth of Lattice–Mismatched Materials," *Applied Physics Letters,* vol. 49 (Jul. 1986), pp. 140–142.

Osbourn et al., "A $GaAs_xP_{1-x}$/GaP Strained–Layer Superlattice," *Applied Physics Letters,* vol. 41 (Jul. 1982), pp. 172–174.

Gourley et al., "Controversy of Critical Layer Thickness for InGaAs/GaAs Stained–Layer Epitaxy," *Applied Physics Letters,* vol. 52(5), (Feb. 1, 1978), pp. 377–379.

Matthews et al., "Accommodation of Misfit Across the Interface Between Crystals of Semiconducting Elements or Compounds," *Journal of Applied Physics,* vol. 41 (Aug. 1970), pp. 3800–3804.

Matthews et al., "Defects in Epitaxial Multilayers I: Misfit Dislocations," *Journal of Crystal Growth,* vol. 27 (1974), pp. 118–125.

Matthews et al., "Defects in Epitaxial Multilayers II: Dislocation Pile–Ups, Threading Dislocations, Slip Lines and Cracks," *Journal of Crystal Growth,* vol. 29 (1975), pp. 273–280.

Matthews et al., "Defects in Epitaxial Multilayers III: Preparation of Almost Perfect Multilayers," *Journal of Crystal Growth,* vol. 32 (1976), pp. 265–273.

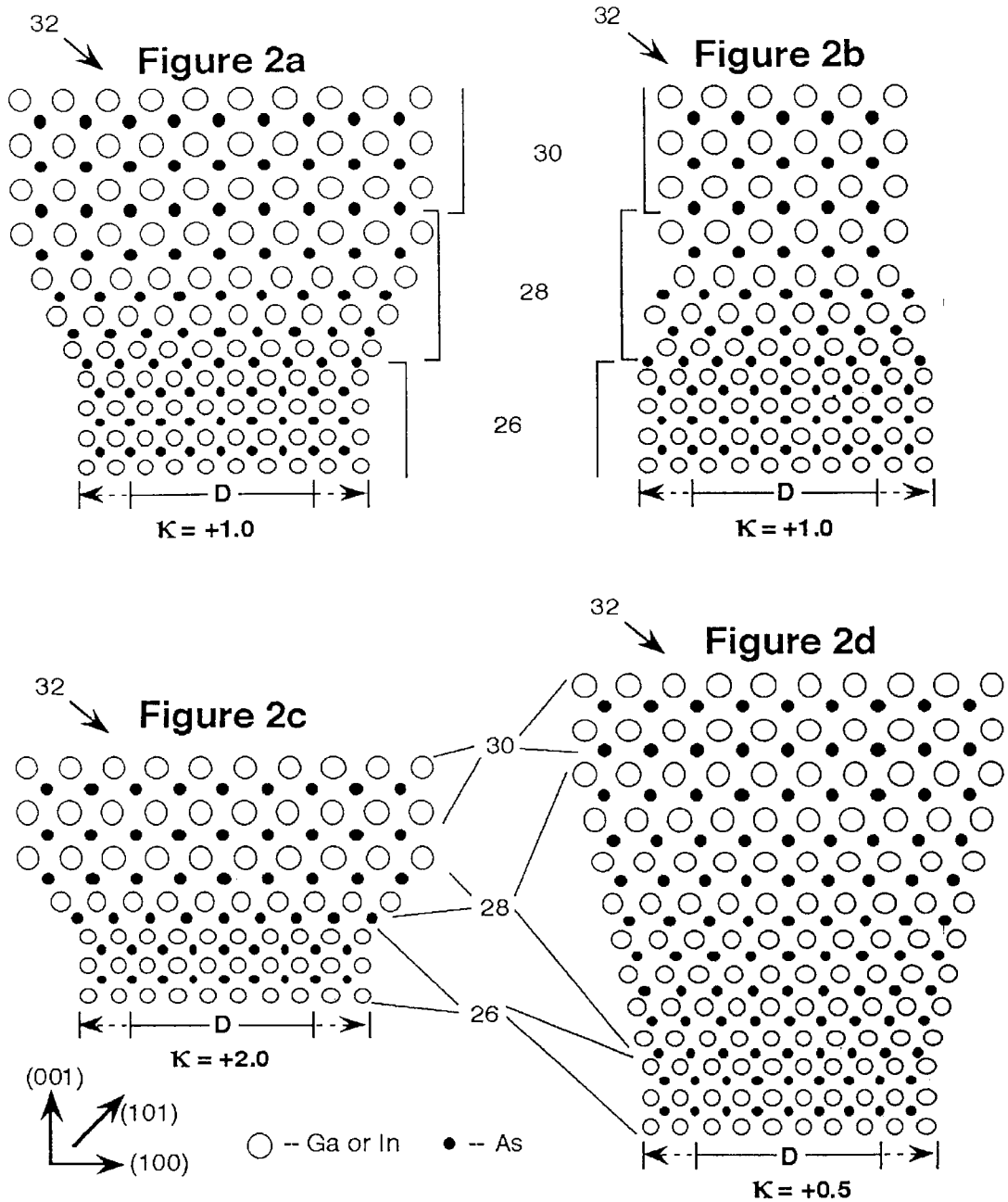

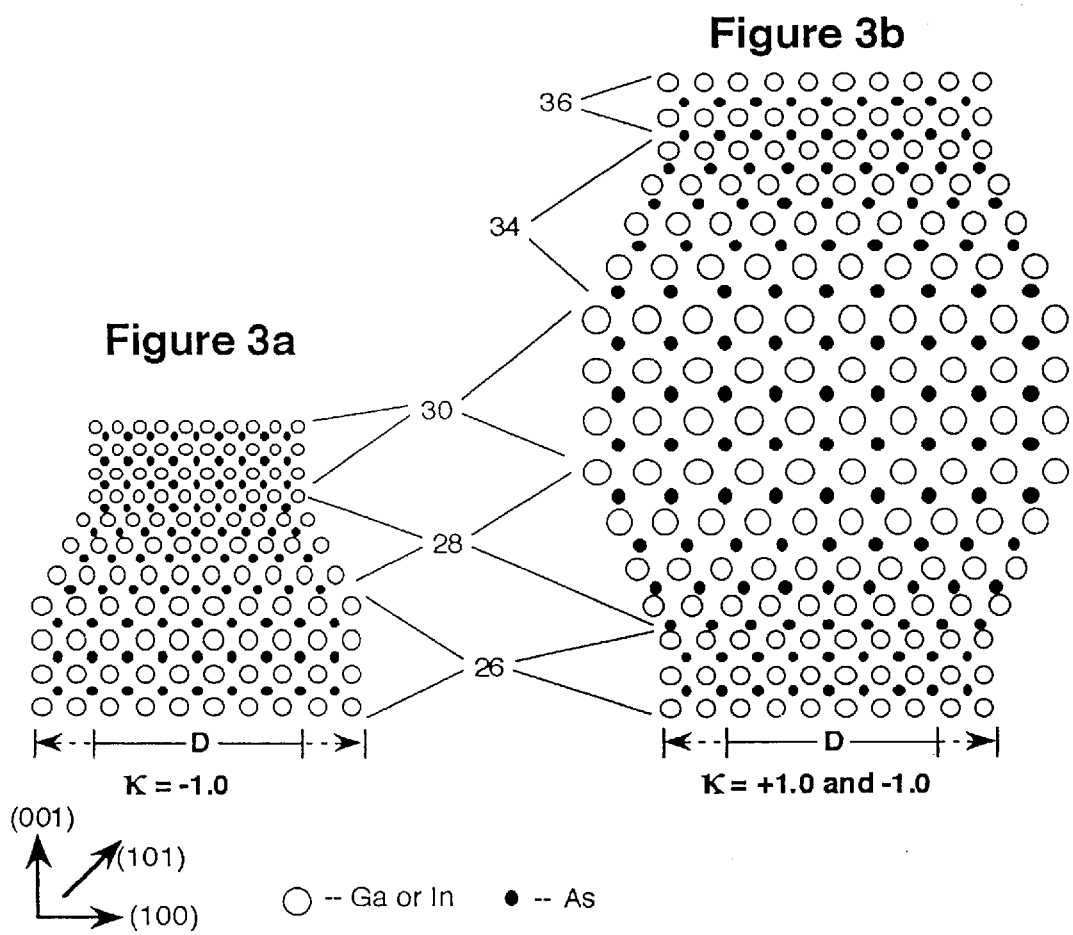

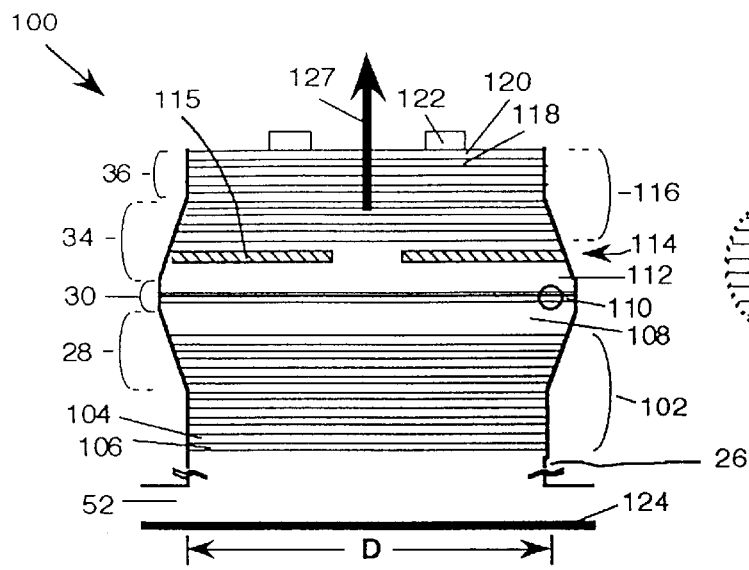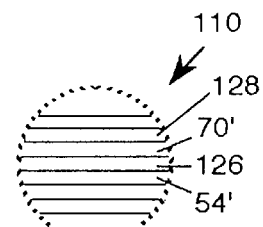
Figure 4a
Figure 4b
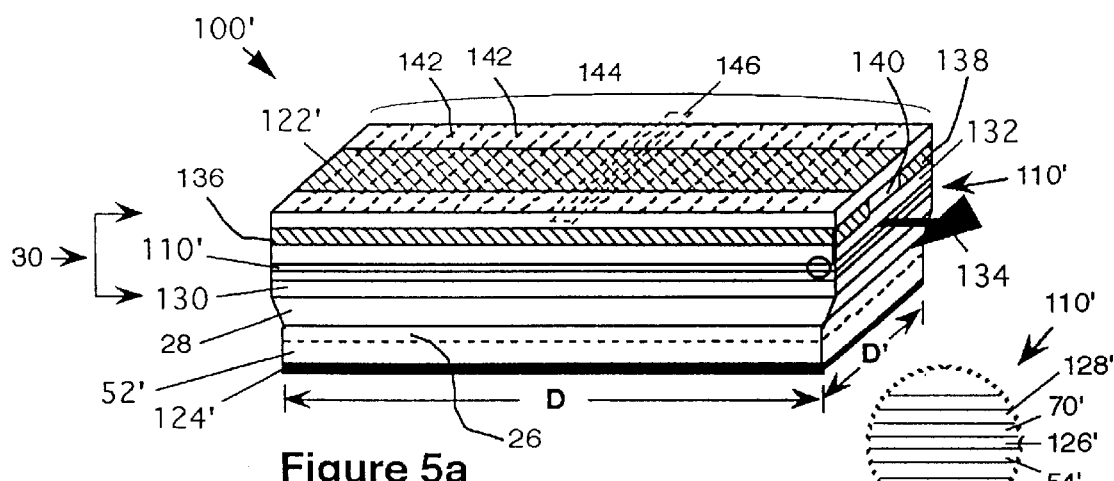
Figure 5a
Figure 5b

EXTENDED WAVELENGTH OPTO-ELECTRONIC DEVICES

This invention is made with government support under contract number DASG60-96-C-0135, awarded by the United States Department of Defense. The government may have certain rights in this invention.

CROSS-REFERENCE TO RELATED APPLICATIONS

This application makes reference to the following co-pending U.S. patent applications. The first application is U.S. application Ser. No. 08/574,165, entitled "Conductive Element with Lateral Oxidation Barrier," filed Dec. 18, 1995. The second application is U.S. application Ser. No. 08/659,942, entitled "Light Emitting Device Having an Electrical Contact Through a Layer containing Oxidized Material," filed Jun. 7, 1996. The third application is U.S. application Ser. No. 08/686,489 entitled "Lens Comprising at Least One Oxidized Layer and Method for Forming Same," filed Jul. 25, 1996. The fourth application is U.S. application Ser. No. 08/699,697 entitled "Aperture comprising an Oxidized Region and a Semiconductor Material," filed Aug. 19, 1996. The fifth application is U.S. application Ser. No. 08/721,769 entitled "Extended Wavelength Strained Layer Lasers Having Short Period Superlattices," filed Sep. 25, 1996. The sixth application is U.S. application Ser. No. 08/721,589 entitled "Extended Wavelength Strained Layer Lasers Having Strain Compensated Layers," filed Sep. 25, 1996. The seventh application is U.S. application Ser. No. 08/721,590 entitled "Extended Wavelength Strained Layer Lasers Having Nitrogen Disposed Therein," filed Sep. 25, 1996. The eighth application is U.S. application Ser. No. 08/739,020 entitled "Extended Wavelength Strained Layer Lasers Having a Restricted Growth Surface and Graded Lattice Mismatch," filed Oct. 28, 1996. The ninth application is U.S. application Ser. No. 08/796,111 entitled "Intra-Cavity Lens Structures for Semiconductor Lasers," filed Feb. 7, 1997. These applications are hereby incorporated by reference.

BACKGROUND OF THE INVENTION

1. Field of the Invention

The present invention relates generally to the dislocation free epitaxial growth of materials having significantly large differences in lattice constant and to semiconductor opto-electronic devices such as LEDs, edge-emitting lasers, VCSELs, detectors, and modulators and more particularly to a semiconductor laser comprising a strained material which is grown on a restricted area surface and has a large lattice mismatch between a substrate and an active region in the semiconductor laser.

2. Description of the Prior Art

Vertical-Cavity Surface-Emitting Lasers (VCSELs), Edge Emitting Lasers (EELs), Light Emitting Diodes (LEDs), photodetectors, or electro-optic modulators (EOMs) are becoming increasingly important for a wide variety of applications including optical interconnection of integrated circuits, optical computing systems, optical recording and readout systems, data communications and telecommunications. Vertically emitting or receiving devices have many advantages over edge-emitting devices, including the possibility for wafer scale fabrication and testing, and the possibility of forming two-dimensional arrays of the vertically emitting devices. The circular nature of the light output beams from VCSELs and surface emitting LEDs also make them ideally suited for coupling into optical fibers as in optical interconnects, data communications, telecommunications or other optical systems for integrated circuits and other applications.

For high-speed optical fiber communications, laser or LED emission wavelengths in the 1.3 $\mu$m through 1.55 $\mu$m region are desired. Standard silica fiber has zero dispersion near 1.3 $\mu$m and has a minimum loss near 1.55 $\mu$m. The need for semiconductor lasers emitting in this wavelength region has spawned worldwide development of such lasers. Group III–V semiconductors which emit light in the 1.3 through 1.55 $\mu$m region have lattice constants which are more closely matched to InP than to other binary III–V semiconductor substrates such as GaAs. Thus, essentially all commercial emitting lasers emitting at 1.3 through 1.55 $\mu$m are grown on InP substrates. These lasers are edge-emitting lasers which, unlike VCSELs, do not require high-reflectivity Distributed Bragg Reflectors (DBRs) to form their optical cavities.

The salient components of a VCSEL typically include two DBRs, and between them, a spacer which contains an active region having a light emitting material. The DBRs and active region form an optical cavity characterized by a cavity resonance at a resonant wavelength corresponding to a resonant photon energy. Unfortunately, it has proven difficult to produce effective DBRs on InP substrates. The available materials which lattice match InP have produced mirrors which are extremely thick and lossy and have thus not resulted in efficient VCSELs.

While epitaxial growth of slightly-lattice-mismatched materials is undertaken routinely, materials which emit in the 1.3 $\mu$m through 1.55 $\mu$m region have lattice constants sufficiently removed from that of GaAs to make pseudo-morphic epitaxial growth problematic. In this context, "pseudomorphic" means having a sufficiently low density of misfit dislocations such that lasers may be produced which have reasonably long lifetimes. For semiconductor lasers, the maximum acceptable density of misfit dislocations or other defects is generally much lower than for other semiconductor devices such as electro-optic modulators or LEDs. The problems have been sufficiently great to cause researchers to abandon such efforts and resort to less desirable hybrid approaches to producing 1.3 $\mu$m through 1.55 $\mu$m VCSELs.

Thus, the production of VCSELs emitting at 1.3 $\mu$m through 1.55 $\mu$m wavelengths has been inhibited by either of two problems. The problems result from the fact that VCSELs require laser-quality active materials and high-reflectivity DBR mirrors. These two problems are:

(1) when InP substrates are used, growth of the light emitting active material is straightforward, but production of efficient DBRs is difficult and has not been effective; and (2) when GaAs substrates are used, DBR production is straightforward, but efforts to grow laser-quality active material have been unsuccessful.

In order to realize such devices, as in the second case above, the misfit dislocations which form as a result of lattice mismatch at high In concentrations or from large epilayer thicknesses must be eliminated. Growth of the strained material on restricted-area surfaces, such as those provided by etching a substrate to form mesas, may allow growth of strained materials to thicknesses well above the Critical Thickness while still keeping free of misfit dislocations. The following is a summary of the prior approaches which are relevant to the problem of producing pseudomorphic semiconductor materials when the materials have a large lattice mismatch.

A detailed, quantitative account of the effects of growth on two-dimensionally-patterned substrates (mesas) is provided by Luryi et al., in an article entitled "New Approach to the High Quality Epitaxial Growth of Lattice-Mismatched Materials," *Applied Physics Letters*, vol. 49 (July 1986), pp. 140–142. Their analysis assumes an abrupt change of lattice constant. Dramatic increases in critical thickness are predicted, but only for very small pattern widths or very low lattice mismatches. Below a maximum width $D_{max}$, the critical thickness is infinite. In other words, the strain force at the interface reaches a saturated level before the onset of misfit dislocations and no longer increases with increasing layer thickness. For a 1% lattice mismatch, $D_{max}$ is about 2.5 $\mu$m (using their FIG. 3 and example of growth of GeSi on Si). Since the mechanical constants of Ge, Si, GaAs, InAs, and InP are not largely different, converting these calculations to InGaAs on GaAs will not cause major departures from the Ge/Si example. At a width of $2D_{max}$, the critical thickness is about twice the nominal critical thickness, i.e., the critical thickness for an infinitely-wide growth surface. Thus, for the example of 1% lattice mismatch, a width of about 5 $\mu$m is required for doubling of the critical thickness. For increasing lattice mismatch, the minimum width decreases rapidly. Turning to FIG. 1a, a chart of Lattice Mismatch v. $D_{max}$ illustrates the area discussed by Luryi et al. and is enumerated by reference numeral 12. As may be seen, the maximum lattice mismatch treated by Luryi et al. is 4% and the largest $D_{max}$ is at or below 10 $\mu$m.

Fitzgerald et al., in an article entitled "Elimination of Interface Defects in Mismatched Epilayers by a Reduction in Growth Area," *Applied Physics Letters*, vol. 52 (May 1988), pp. 1496–1498, reports growth of $In_{0.05}Ga_{0.95}As$ layers 3500 Å thick on patterned GaAs in which the number of misfit dislocations was "nearly zero for 25 $\mu$m lateral dimensions," i.e., $D_{max}$ equals 25 um. This article goes on to state that the actual number of dislocations on 25 $\mu$m diameter mesas varied between 0 and 3. Therefore, this structure is not always dislocation free. There was an abrupt transition from the GaAs to $In_{0.05}Ga_{0.95}As$, and layers were >4 times the CT. Given the very small lattice mismatch of <0.36%, the estimated $D_{max}$ is about 40 $\mu$m by extrapolating the data from Luryi. Turning now to FIG. 1a, this data by Fitzgerald et al. is illustrated by filled circle 14. Fitzgerald et al. also reports that growth on mesas makes it possible to eliminate the generation of misfit dislocations through threading dislocations present in the substrate. The reader is also referred to U.S. Pat. Nos. 5,032,893 and 5,156,995, which discuss the subject matter of the above article by Fitzgerald et al.

Madhukar et al., in an article entitled "Realization of Low Defect Density, Ultrathick, Strained InGaAs/GaAs Multiple Quantum Well Structures Via Growth on Patterned GaAs (100) Substrates," *Applied Physics Letters*, vol. 57 November 1990), pp. 2007–2009, reported growth of InGaAs/GaAs multiple quantum wells to 2.4 $\mu$m total thickness on ~16×18 $\mu$m mesas. The average In concentration was about 6.7% (<0.48% average mismatch), and the estimated value of $D_{max}$, is 30 $\mu$m by extrapolating the data of Luryi. They also report that central regions of the mesas appeared virtually free from structural defects, but the regions within 2–3 $\mu$m of the edges did not have good layering. They suspect migration of atoms to be responsible for the poor layering near the edges. Turning now to FIG. 1a, this data by Madhukar et al. is illustrated by filled circle 16.

Since VCSELs are presently the subject of intense research and development, a great deal of results and advancements are published periodically. The following is a list of documents which are relevant to the problem of producing pseudomorphic semiconductor materials when the materials have a large lattice mismatch.

Matthews et al., "Defects in Epitaxial Multilayers I: Misfit Dislocations," *Journal of Crystal Growth*, vol. 27 (1974), pp. 118–125.

Matthews et al., "Defects in Epitaxial Multilayers II: Dislocation Pile-Ups, Threading Dislocations, Slip Lines and Cracks," *Journal of Crystal Growth*, vol. 29 (1975), pp. 273–280.

Matthews et al., "Defects in Epitaxial Multilayers III: Preparation of Almost Perfect Multilayers," *Journal of Crystal Growth*, vol. 32 (1976), pp. 265–273.

Yacobi et al., "Stress Variations and Relief in Patterned GaAs Grown on Mismatched Substrates," *Applied Physics Letters*, vol. 52 (February 1988), pp. 555–557.

Guha et al., "Defect Reduction in Strained $In_xGa_{1-x}As$ Via Growth on GaAs (100) Substrates Patterned to Submicron Dimensions," *Applied Physics Letters*, vol. 56 (June 1990), pp. 2304–2306.

Chand et al., "Elimination of Dark Line Defects in GaAs-on-Si by Post-Growth Patterning and Thermal Annealing," *Applied Physics Letters*, vol. 58 (January 1991), pp. 74–76.

Koyama et al., "Wavelength Control of Vertical Cavity Surface-Emitting Lasers by Using Nonplanar MOCVD," *IEEE Photonics Technology Letters*, vol. 7 (January 1995), pp. 10–12.

In addition, the following U.S. patents may be of interest: U.S. Pat. Nos. 5,512,375; 5,448,084; 5,294,808; 5,156,995; 5,091,767; 5,032,893; 5,019,874; and 4,806,996.

The prior art lacks any means to grow laser-quality materials having large mismatches, e.g. $\geq 1\%$, on mesa sizes appropriate for laser fabrication, e.g. $\geq 10 \mu$m, to thicknesses desired for many devices, e.g., well above their critical thicknesses for large-area growth. To achieve $\geq 1.3$ $\mu$m emission on GaAs substrates, lattice mismatches of about 2.5% or greater are required. With 2.5% mismatch, mesa widths less than about 1000 Å are required for thick, defect-free growth, as determined from the data by Luryi. Growth of $\geq 2.2$ $\mu$m-emitting material on InP substrates is expected to require InAs or InAsSb which has >3.2% mismatch from InP. The prior art of patterned substrate growth is thus unable to address the goals of this work in any practical way.

The graded-lattice-constant layers taught by the prior art are completely lacking in ability to produce dislocation-free structures which are well above their respective critical thicknesses. Although references may speak of "almost perfect multilayers," or "device quality" material, at best this refers to an as-grown layer wherein the graded region below has very high defect density. If such layers were used in an active layer for a semiconductor laser, the underlying defects would quickly propagate into the active layer and the laser would be very short lived. This is the case for 1.3 $\mu$m lasers grown on GaAs of the type described by Omura et al., "Low Threshold Current 1.3 $\mu$m GaInAsP Lasers Grown on GaAs Substrates," Electronic Letters, vol. 25, no. 25, pp. 1718–1719, Dec. 7, 1989; or the structures described by Melman et al., "InGaAs/GaAs Strained Quantum Wells with a 1.3 $\mu$m Band Edge at Room Temperature," Applied Physics Letters, vol. 55, pp. 1436–1438, Oct. 2, 1989.

SUMMARY OF THE INVENTION

It is therefore an object of the present invention to provide a semiconductor structure which will provide lattice matching between two layers having a large difference in lattice constant.

It is a further object to provide an extended wavelength laser, on a GaAs substrate, which may emit at 1.3 μm or greater.

It is a further object to provide a laser having a long life and being easily manufacturable.

It is yet another object to provide an active region on a substrate where the lattice mismatch between the substrate and the active region is 0.0014 or greater.

According to one broad aspect of the present invention, there is provided a semiconductor structure comprising: a first layer on a restricted growth surface having a first central region with a transverse dimension D and having a first average lattice constant $L_1$ within the first central region; a first, last and at least one intermediate transition layers, the transition layers forming a transition region, the transition region disposed above the first layer, the transition region having a vertical thickness T, and where at least one of the intermediate transition layers has average lattice constants between $L_1$ and a second average lattice constant $L_c$ where the first transition layer has a lattice constant closer to the $L_1$ than $L_c$ and the last transition layer has a lattice constant closer to the $L_c$ than $L_1$; and a second layer disposed on the transition region, the second layer having a second average lattice constant $L_2$, the second layer having a second central region having the average lattice constant $L_c$ and an average lattice constant $L_3$ outside of the second central region, and where $L_c$ does not equal $L_3$; wherein: the transition region has an average fractional change in lattice constant characterized by κ where $\kappa=(D/T)\{(L_c-L_1)/L_1\}$, where $|\kappa|<18$ and wherein a lattice mismatch $|L_c-L_1|/L_1 \geq 0.0014$.

According to another broad aspect of the invention, there is provided a semiconductor structure comprising: a first layer, the first layer having a restricted growth surface having a first central region with a transverse dimension D, the first layer having a first average lattice constant $L_1$ within the first central region; a first, last and at least one intermediate transition layers, the transition layers forming a transition region, the transition region disposed above the first layer, the transition region having a vertical thickness T, and where at least one of the intermediate transition layers has average lattice constants between $L_1$ and a second average lattice constant $L_2$ where the first transition layer has a lattice constant closer to the $L_1$ than $L_2$ and the last transition layer has a lattice constant closer to the $L_2$ than $L_1$, at least one of the transition layers having a second central region having an average lattice $L_c$ which is between the $L_1$ and $L_2$ and an average lattice constant $L_3$ outside of the second central region, and where $L_c$ does not equal $L_3$; and a second layer disposed on the transition region, the second layer having the second average lattice constant $L_2$; wherein: the transition region has an average fractional change in lattice constant characterized by κ where $\kappa=(D/T)\{(L_c-L_1)/L_1\}$, where $|\kappa|<18$ and wherein a lattice mismatch $|L_c-L_1|/L_1 \geq 0.0014$.

According to another broad aspect of the invention, there is provided a semiconductor structure comprising: a first layer, the first layer having a restricted growth surface having a first central region with a transverse dimension D and having a first average lattice constant $L_1$ within the first central region; a first, last and at least one intermediate transition layers, the transition layers forming a transition region, the transition region disposed above the first layer, the transition region having a vertical thickness T, and where at least one of the intermediate transition layers has average lattice constants between $L_1$ and a second average lattice constant $L_2$ where the first transition layer has a lattice constant closer to the $L_1$ than $L_2$ and the last transition layer has a lattice constant closer to the $L_2$ than $L_1$; and a second layer disposed above the transition region, the second layer having the second average lattice constant $L_2$; wherein: the transition region has an average fractional change in lattice constant characterized by κ where $\kappa=(D/T)\{(L_2-L_1)/L_1\}$, where $-18<\kappa<0$ and wherein a lattice mismatch $|L_2-L_1|/L_1 \geq 0.0014$.

According to another broad aspect of the invention, there is provided a semiconductor structure comprising: a first layer, the first layer having a restricted growth surface having a first central region with a transverse dimension D and having a first average lattice constant $L_1$ within the first central region; a first, last and at least one intermediate transition layers, the transition layers forming a transition region, the transition region disposed above the first layer, the transition region having a vertical thickness T, and where at least one of the intermediate transition layers has average lattice constants between $L_1$ and a second average lattice constant $L_2$ where the first transition layer has a lattice constant closer to the $L_1$ than $L_2$ and the last transition layer has a lattice constant closer to the $L_2$ than $L_1$; and a second layer disposed above the transition region, the second layer having the second average lattice constant $L_2$; wherein: the transition region has an average fractional change in lattice constant characterized by κ where $\kappa=(D/T)\{(L_2-L_1)/L_1\}$, where $0<\kappa<18$ wherein a lattice mismatch $|L_2-L_1|/L_1 \geq 0.0014$.

Other objects and features of the present invention will be apparent from the following detailed description of the preferred embodiment.

BRIEF DESCRIPTION OF THE DRAWINGS

The invention will be described in conjunction with the accompanying drawings, in which:

FIGS. 2a through 2d illustrate techniques for growing an arbitrarily thick layer of lattice mismatched material without the generation of misfit dislocations by using a transition region in accordance with a preferred embodiment of the invention;

FIG. 3a illustrates a technique for growing an arbitrarily thick layer of lattice mismatched material without the generation of misfit dislocations by using a transition region, where the new lattice constant is smaller than the first, in accordance with a preferred embodiment of the invention;

FIG. 3b illustrates a technique for growing an arbitrarily thick layer of lattice mismatched material without the generation of misfit dislocations by using two transition regions and in accordance with a preferred embodiment of the invention;

FIG. 4 is a graph of peak transition energy and peak transition wavelength v. lattice constant for a wide variety of semiconductor elements and compounds;

FIG. 5 is a graph of peak transition energy and peak transition wavelength v. lattice constant for selected binary and ternary group III–V semiconductor compounds having a cubic (zinc-blende) crystal structure;

DETAILED DESCRIPTION OF THE PREFERRED EMBODIMENT

Figure 1A:
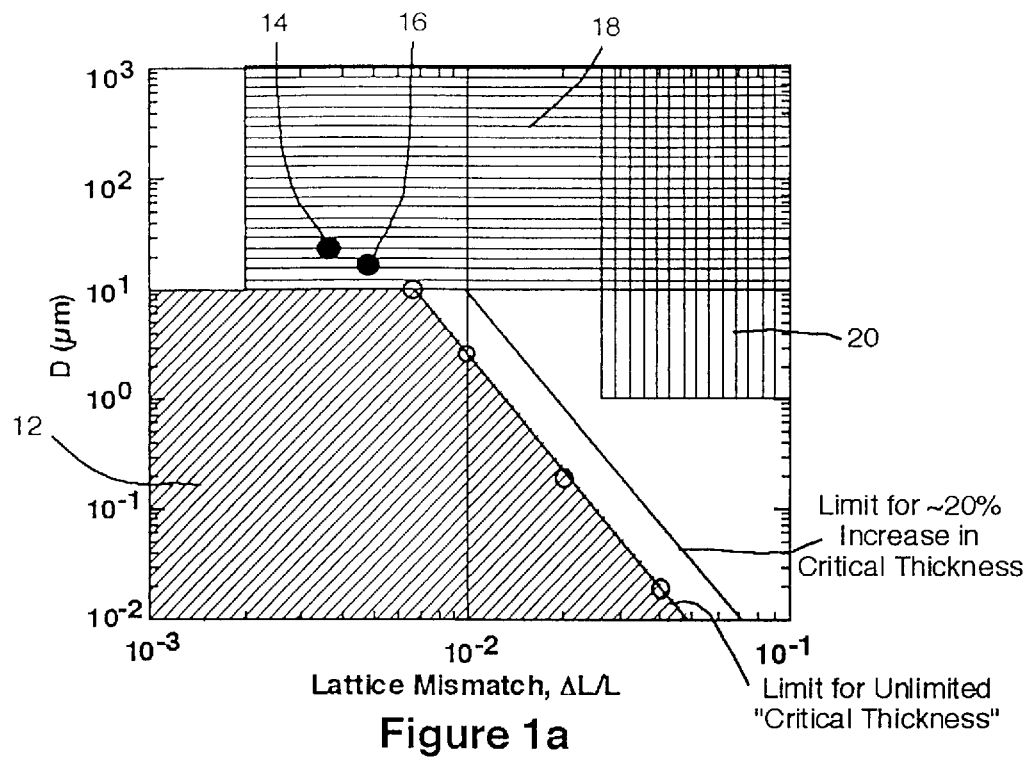
FIG. 1a is a graph of Lattice Mismatch v. D for a variety prior art devices as well as the inventive devices constructed in accordance with a preferred embodiment of the invention.

It is advantageous to define several terms before describing the invention. It should be appreciated that the following definitions are used throughout this application.

The term "GaAs" or "Gallium Arsenide" refers to a semiconductor composition which may be used as a substrate. Nominally, the prototypical III–V binary semiconductor material consisting of equal parts of the two elements Ga and As are used to form the semiconductor material. It should be appreciated that some deviations, to meet device needs or unwanted impurities, may be permitted which continue to use established GaAs fabrication procedures. To permit for anticipated need for impurities or other relatively insignificant modifications, it is prescribed that both Ga and As are present and combine to form an amount of at least 95% of the substrate's entire composition. GaAs has a lattice constant of about 5.6533 Å. Additionally, it should be appreciated that the term "substrate" may include any material underneath the active layer. For example, mirror layers, waveguide layers, cladding layers or any other layer underneath the active layer.

The term "InGaAs" refers to a semiconductor material comprising at least In, Ga, and As in any concentrations with respect to each other.

In a similar fashion, all chemical compounds specified in this application comprise at least some percentage of their constituent elements in any concentration with respect to each other, unless the concentrations are specifically enumerated.

All concentrations for chemical elements are provided in ratios which range from 0.0 to 1.0, where 1.0 corresponds to 100% of that element. It should also be appreciated that when we discuss an element in a group III or V semiconductor material, the ratio applies to the concentration of the elements in either the group III or group V materials and not the entire semiconductor material. For example, an In concentration of 0.5 would correspond to 50%. In concentration of the group III material used to construct the semiconductor material and not to 50% of the entire semiconductor material. This scheme is used throughout the application unless specifically enumerated. It should be appreciated that other group elements such as I, II, IV, VI, VII, VIII, transition, or rare-earth elements, in small quantities, may also be utilized in conjunction with the group III/V materials. The same scheme for expressing the concentrations is used for all groups of materials.

The term "Critical Thickness" discussed in greater detail below, is generally referred to as the critical thickness based on the criteria developed by Matthews and Blakeslee. For a detailed discussion of Critical Thickness, the reader is referred to the article entitled "Defects in Epitaxial Multilayers: I Misfit Dislocations," published in the Journal of Crystal Growth, vol. 27, pp. 118–125 (1974) and to James Coleman's book, entitled *Quantum Well Lasers*, published by Academic Press, London, (1993) pp. 372–413. For materials epitaxially grown on large-area (100) oriented GaAs and in the absence of strain compensation, the value of critical thickness may be determined by the following formula:

$$CT = (0.4374/f)[ln(CT/4)+1] \tag{1}$$

where f is the lattice mismatch normalized to the GaAs lattice constant, or more commonly referred to as strain. The strain may be determined by the portion of In or other elements present in the InGaAs semiconductor material. For example, for $In_y Ga_{1-y} As$ on GaAs, f equals 0.07164 multiplied by y, where y varies between 0.0 and 1.0. Generally, the CT is measured in Å and varies between 71.9 Å and 13.6 Å for $In_y Ga_{1-y} As$ where y varies between 0.33 and 1.0.

For a strained $In_y Ga_{1-y} As$ semiconductor material on a InP substrate, the equivalent expression is:

$$CT = (0.454/f)[ln(CT/4.15)+1] \tag{2}$$

where f is the lattice mismatch normalized to the InP lattice constant, or more commonly referred to as strain. This expression is for materials epitaxially grown on (100) oriented InP and in the absence of strain compensation. The strain may be determined by the portion of In or other elements present in the InGaAs semiconductor material. For example, for $In_yGa_{1-y}As$ on InP, f equals $0.032368\times[(y-0.53)/0.47]$, where y varies between 0.0 and 1.0. When y=0.53, the $In_yGa_{1-y}As$ is lattice matched to InP. Henceforth, the term CT on nominal GaAs or InP substrates shall refer to the solution of equation (1) or (2), respectively. The term CT may also apply to the solution of equations equivalent to (1) and (2) for materials grown on other substrates. It should be appreciated that the term "Critical Thickness" is more general, but less precisely defined.

Additionally, it should be appreciated that the CT's as defined in equations (1) and (2) are valid for strained-layer structures on a thick substrate and having a sufficiently thick overlayer(s) of unstrained material grown on top. This is the structure used for most device applications. As described by Matthews & Blakeslee, absence of the thick substrate results in a doubling of the critical thickness, while absence of the overlayer halves the critical thickness. Vawter et al., in an article entitled "Useful Design Relationships for the Engineering of Thermodynamically Stable Strained-layer Structures," Journal of Applied Physics, vol. 65, pp. 4769–4773, 1989, discusses the minimum required thickness of the overlayer(s).

In this context, the term "pseudomorphic" is used to describe a semiconductor material which is substantially free of misfit or threading dislocations and being constrained to the lattice constant of the substrate in the transverse direction, i.e., horizontal direction. Generally, for the purposes of this application, well-grown semiconductor layers which have a thickness below their respective CTs will be pseudomorphic. Additionally, by utilizing the teachings, one may construct a pseudomorphic semiconductor material which is above its respective critical thickness while maintaining the level of misfit dislocations which would be present if the semiconductor material had a thickness below the CT. In the context of this application, "pseudomorphic" may also refer to selected regions. For example, the central region of a growth area may be pseudomorphic whereas the outer portions may contain misfit dislocations. This concept is discussed in greater detail below.

Before continuing with the definitions of certain terms, it is essential to explain how dislocations may be detected. In order to test for dislocations, a number of techniques are know in the semiconductor art. For example, Gourley et al., describes the use of photoluminescence microscopy (PLM) to detect "dark lines" which result from dislocations. The Gourley et al. article is hereby incorporated by reference. In fact, Gourley used PLM to determine whether or not a strained layer was grown above its critical thickness. PLM may be used directly and nondestructively on VCSELs. Since EELs usually have a metallic contact over the active region, the contact must be removed in order to test the active region. Alternatively, for VCSELs or EELs, the device may be removed from its package, allowing optical access from the bottom of the device. Since both GaAs and InP substrates are fairly transparent to wavelengths over 1 $\mu$m, there is no need to remove the substrate. The presence of a single dark line in a VCSEL or EEL device is sufficient to determine that the device is not pseudomorphic.

Other techniques are available and are known in the semiconductor art. Electron beam induced current (EBIC) is another test which is nondestructive for VCSELs. EBIC detects dislocations in the active region. As with PLM, a single dislocation detected by EBIC is sufficient to determine that the structure is not pseudomorphic. High resolution electron microscopy (HREM) allows sufficiently high magnification to observe atomic dislocations as described by Fang & Morkoc, which is entitled "Integrated Optoelectronics," Academic Press, pp. 170–173, 1995. It should be appreciated that under long-term or high-stress operation, "dark lines" or dislocations will develop in any semiconductor lasers or LEDs. For the purposes of this discussion, it is assumed that the testing for dislocations is performed under conditions in which the device has undergone normal operation for 1,000 hours or less.

This application makes a distinction between the nominal lattice constant, i.e., the lattice constant the material would have in a bulk crystal form, and the grown lattice constant, i.e., the lattice constant the material takes on when grown on a given structure. For example, a monolayer of InAs grown pseudomorphically on GaAs and overlaid with GaAs will assume the same horizontal grown lattice constant as GaAs, even though the nominal lattice constant of InAs is about 7% larger than that of GaAs. It is also important to note that the grown lattice constant may change after its deposition, depending upon the material grown over it. Even the GaAs on the pre-growth GaAs mesa may expand slightly after growth of strained material and therefore have a grown lattice constant different from normal GaAs. Hereinafter, the grown lattice constant will refer to its final value after all layers are grown.

For the purposes of this application, the following lattice constants have been used consistently throughout the application: GaAs=5.6533, AlAs=5.6611; GaP=5.4512, InP=5.8688, InAs=6.0584, Si=5.431, SiC=4.357, and $Al_2O_3$=3.6 Angstroms. It should be appreciated that numerous references provide values for these semiconductor materials which differ among themselves. Therefore, it is essential to select a particular value which is within acceptable norms of these references. Thus, the lattice mismatch between GaAs and AlAs is 0.00138 if the above values are utilized.

Reference has been made to a lateral dimension D. For devices, e.g., lasers or LEDs, D is defined as the maximum lateral dimension in the active region through which, during normal operation, electrical current flows with a current density of at least 25 $A/cm^2$. For VCSELs, D is usually the maximum lateral dimension of the current confining structure, if present. Current spreading may result in D being somewhat larger than the current confining structure. If there is no current confining structure, the general definition for D would apply. Examples of current confining structures include, but are not limited to, an oxide-defined aperture or an implantation-defined aperture. For EELs, D is usually equal to its length. For photodetectors, D is usually equal to the lateral dimension of the mesa, however it may be smaller, especially if a current-confining aperture is present.

In the devices discussed herein, reference is made to an active region which refers to a region of material which generates, absorbs, or acts upon light. For lasers and LEDs, the active region generates light. For photodetectors, the active region absorbs light. For EOMs, the active region changes its optical properties in response to an electrical signal and therefore modulates the transmission, reflection, absorption or scattering of an incident beam of light.

A technique and structure is now described which may allow the growth of arbitrarily thick layers of lattice-mismatched material without the generation of misfit dislocations. The general area of interest may be seen in FIGS. 1a and 1b. The area of general device interest for the inventive devices would include, but is not limited to, shaded regions 18 and 20. The area corresponding to materials grown directly on GaAs substrates and having emission wavelengths of 1.3 µm or greater on a GaAs substrate is illustrated by shaded region 20 and 20', respectively. As may be seen in FIG. 1a, region 18 corresponds to a lattice mismatch between $2\times10^{-3}$ and $1\times10^{-1}$ and a D greater than or equal to 10 µm. Similarly, region 20 corresponds to a lattice mismatch between $2.5\times10^{-2}$ and $1\times10^{-1}$ and a D greater than or equal to 1 µm. As may be seen in FIG. 1b, regions 18' and 20' are bounded at one end by κ less than or equal to 10. In the D/T axis of FIG. 1b, the quantity T is the thickness of a region having a gradient in lattice constant, as discussed below. For convenience, FIG. 1a has upper and right boundaries established at $10^3$ and $10^{-1}$. It should be appreciated that FIG. 1a is merely illustrative and the inventive concept contemplates regions greater than these illustrated boundaries. In a similar manner, the lower boundary for D/T is illustrated as $10^0$.

Figure 1B:
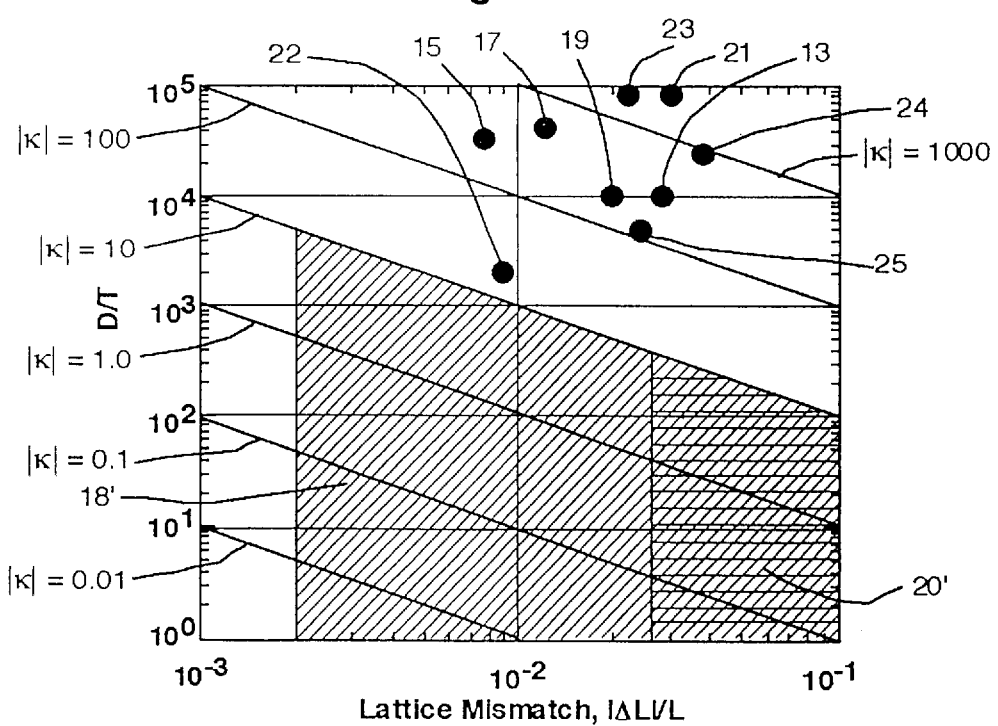
FIG. 1b is a graph of Lattice Mismatch v. D/T and showing several values of κ for a variety prior art devices as well as the inventive devices constructed in accordance with a preferred embodiment of the invention.

FIG. 1b also provides information as to prior art devices. For example, filled circle 22 corresponds to data by Matthews & Blakeslee III and filled circle 24 corresponds to data by Chin & Tu.

J. C. P. Chang et al. in a publication entitled "Strain Relaxation of Compositionally Graded $In_xGa_{1-x}As$ Buffer Layers for Modulation-Doped $In_{0.3}Ga_{0.7}As/In_{0.29}Al_{0.71}As$ Heterostructures," *Applied Physics Letters*, vol. 60, March 1992, pp. 1129–1131, disclose the use of a step-graded region of 3 InGaAs layers grown on GaAs. Each layer is 3000 Å thick and increases the In concentration by 10%. The layers comprise InGaAs with 10%, 20% and 30% In. The material grown on top of this transition region has only 29% In. Thus, the thickness T of the region transitioning from 0% to 30% Indium is 0.6 µm, i.e., only 2 of the layers accomplish the transition. The change in lattice constant is $\Delta L/L=0.0215$. Assuming a substrate diameter of 2" (50 mm), D/T=83,333. Thus, for this structure, κ=1,792. This data is plotted as filled circle 23 in FIG. 1b.

L. J. Stinson et al. in a publication entitled "High-Efficiency InGaP Light-Emitting Diodes on GaP Substrates," *Applied Physics Letters*, vol. 58, May 1991, pp.2012–2014, disclose the use of a thick graded region of InGaP grown on GaP. The parameters are not precisely specified, but an order-of-magnitude estimate may be obtained. A reference to the article states the graded region thickness as 10 µm, which is consistent with FIG. 1 on Stinson's publication. The materials grown on top of this graded region in various structures had photoluminescence peak wavelengths all larger than 550 nm. This requires a lattice mismatch $\Delta L/L>0.023$. Assuming a substrate diameter of 2" (50 mm), D/T=5,000. Thus for this structure, κ=115, which is considered to be an overestimate of the minimum value of κ for this work. This data is plotted as filled circle 25 in FIG. 1b.

G. C. Osbourn et al. in a publication entitled "A $GaAs_xP_{1-x}$/GaP Strained-Layer Superlattice," *Applied Physics Letters*, vol. 41, July 1982, pp. 172–174, disclose the use of a graded region of InGaP grown on GaP. The graded region thickness is T=1.5 µm. The grade is to 20% In, producing $\Delta L/L=0.0075$. Assuming a substrate diameter of 2" (50 mm), D/T=33,333. Thus, for this structure, κ=250. This data is plotted as filled circle 15 in FIG. 1b.

T. P. Chin et al. in a publication entitled "Gas-Source Molecular Beam Epitaxial Growth, Characterization, and Light-Emitting Diode Application of $In_xGa_{1-x}P$ on GaP (100)," *Applied Physics Letters*, vol. 62, May 1993, pp. 2369–2371, discloses the use of a graded region of InGaP grown on GaP. The graded region thickness is T=1.2 µm. The grade is to 32% In, producing $\Delta L/L=0.012$. Assuming a substrate diameter of 2" (50 mm), D/T=41,667. Thus, for this structure, κ=500. This data is plotted as filled circle 17 in FIG. 1b.

E. A. Fitzgerald et al. in a publication entitled "Totally Relaxed $Ge_xSi_{1-x}$ Layers with Low Threading Dislocation Densities Grown on Si Substrates," *Applied Physics Letters*, vol. 59, August 1991, pp. 811–814, discloses the use of a graded region of GeSi grown on Si. The graded region is specified to have a gradient in Ge concentration of 10%/µm. Thus, $\Delta L/(LT)=0.004/\mu m$. The grade proceeds up to Ge concentrations as high as 53%. For plotting convenience, this data is plotted for a Ge concentration of 50%. Thus, the thickness T=5 µm and the lattice mismatch is $\Delta L/L=0.02$. Assuming a substrate diameter of 2" (50 mm), D/T=10,000. Thus, for this structure, κ=200. This data is plotted as filled circle 19 in FIG. 1b.

P. Ribas et al. in a publication entitled "Device Quality $In_{0.4}Ga_{0.6}As$ Grown on GaAs by Molecular Beam Epitaxy," *Applied Physics Letters*, vol. 57, September 1990, pp. 1040–1042, discloses the use of a step-graded region of InGaAs grown on GaAs. The region in which the lattice constant is increasing has a thickness of T=0.599 µm. The grade is to 43% In, producing $\Delta L/L=0.031$. Assuming a substrate diameter of 2" (50 mm), D/T=83,472. Thus, for this structure, κ=2,587. This data is plotted as filled circle 21 in FIG. 1b.

F. K. LeGoues et al. in a publication entitled "Mechanism and Conditions for Anomalous Strain Relaxation In Graded Thin Films and Superlattices," *Journal of Applied Physics*, vol. 71, May 1992, pp. 4230–4243, discloses the use of graded regions of SiGe grown on Si and of InGaAs grown on GaAs. The most gradual grade in the InGaAs growth was over a thickness T=1 µm as determined from FIG. 15c of the publication. This grade attained an In concentration of 40% for a lattice mismatch $\Delta L/L=0.0286$. Assuming a substrate diameter of 2" (50 mm), D/T=50,000. Thus, for this structure, κ=1,430. This data is plotted as filled circle 13 in FIG. 1b.

As may be seen, there is no overlap between the inventive regions and the known prior art. The prior art attempts to use graded layers fail to produce a defect-free transition region because the gradients used are far too high. As will be seen in the following analysis and illustrations, defect-free transition regions may be produced when they are described by a value of |κ| which is on the order of unity. As seen in FIG. 1b, all prior art descriptions of graded regions have values of |κ| which are well above 10, when calculated for 2-inch diameter substrates. The lowest value for |κ| in FIG. 1b is 18. Even if this structure were to be grown on a tiny 21 mm diameter substrate, the value for |κ| would be >7.5. All the other references have |κ|>100 for 2-inch substrates.

The basis of the technique is illustrated in FIG. 2a. Starting from the bottom, epitaxial growth is performed on a restricted area, e.g., a mesa 26. Mesa 26 may be formed by etching away the surrounding substrate material and may be, for example, circular, rectangular, square, cloverleaf or any other shape. It should be appreciated that the restricted area may be generated by utilizing a mask in the epitaxial growth process instead of etching the substrate. For example, a layer of patterned silicon nitride, ~300 Å or thicker, inhibits growth by MOCVD. An external mask, for example patterned metal, may also restrict the growth area. Alternatively, a heavy ion implantation in selected regions may inhibit crystalline growth, thereby inhibiting the accumulation of stress forces. Still another means for accomplishing restricted area growth is via enhancing the growth by an external energy source, for example a laser. A typical mesa 26 would have transverse dimension D which may be greater than or equal to 10 μm and a height of at least 0.05 μm. It should be appreciated that the transverse dimension D, as discussed above, may encompass the entire mesa 26 or may only correspond to a central region 32. In lasers, D is defined as the maximum lateral dimension in the active region through which, during normal operation, electrical current flows with a current density of at least 25 A/cm$^2$. In photodetectors, D is defined as the maximum lateral dimension in the active (absorbing) region through which, during normal operation, electrical current flows with a current density of at least $1/e^2$ of its maximum value. In EOMs, D is defined as the maximum lateral dimension in the active region through which, during normal operation, the intensity of the modulated light is at least $1/e^2$ of its maximum value. The height of mesa 26 must be sufficiently large, compared to a transition region 28, discussed below.

The transverse dimension D is additionally significant because threading dislocations may propagate laterally over large distances during growth, even a low density of threading dislocations in the substrate may cause a high density of misfit dislocations in the grown material. When mesa 26 is sufficiently small such that there is a statistical improbability of having a threading dislocation on a surface of mesa 26, then there will be no mechanism for threading dislocations to generate misfit dislocations. Furthermore, the lateral propagation of threading dislocations in the substrate does not occur at the interfaces of mesa 26. This effect in itself does not increase the theoretical critical thickness, but it helps attain it in a practical imperfect environment. It should be appreciated that while we have referred to the restricted growth surface as a mesa, it may also be an etched recess or a surface defined by masking, incident external energy, patterned disorienting, or any other means.

Next, transition region 28 is grown directly on mesa 26. It should be appreciated that there may be intermediate material between the top of mesa 26 and transition region 28 so long as this intermediate material has a lattice constant which is within 0.1% of that of mesa region 26. Otherwise the "intermediate" material may be part of transition region 28. Additionally, material may be grown on a substrate prior to the formation of mesa 26.

In FIG. 2a, the last 4 atomic periods are shown for material at the substrate lattice constant, for example, growth of 4 monolayers of GaAs or AlGaAs on a mesa 26 formed on a GaAs substrate. It should be appreciated that these monolayers are an integral part of mesa 26. For clarity, the lower part of mesa 26 is not illustrated. Additionally, it should be appreciated that additional material may be grown for increasing the height of mesa 26. Transition region 28 is then grown in which the lattice constant of the grown material gradually varies. In the example of FIG. 2a, the lattice constant increases, but it may decrease just as well. One may tell that the lattice constant is increasing since transition region 28 gradually tapers outwardly as transition region 28 is grown. It should be appreciated that the figures illustrate a graded transition region. It is possible to have layers in the transition region which do not correspond to a gradually graded region, for example a step-graded region. In fact a layer in the transition region may have a lattice constant which is greater or less than either the substrate or new lattice constant region, discussed below.

The transition region effectively re-defines the lattice constant at which strain-free material may be grown. At the top of transition region 28, material 30 of a new lattice constant may be grown to arbitrarily-large thicknesses without misfit dislocations, as long as the new lattice constant is reasonably close to that of the top of the transition region or if it is sufficiently thin, i.e., it must be below its respective Critical Thickness. In FIG. 2a, the last layer of material having the substrate lattice constant and the first layer of the new lattice constant may both be considered to be part of transition region 28.

As may be seen by comparing FIGS. 2a and 2b, the edges of the transition regions may vary considerably without affecting central portions 32 of the transition and new-lattice-constant regions. For small total changes in lattice constant, e.g. <10% and κ≈1 as defined below, the change in mesa diameter will usually be less than about 10%.

It is to be appreciated that the patterned means for restricting the area of epitaxial growth may also produce local nonuniformities in the growth characteristics. For example, there may be nonuniform material composition over the growth area. Bhat, in the chapter entitled "Organometallic Chemical Vapor Deposition," published in the book *Integrated Optoelectronics*, edited by Dagenais, Leheny and Crow, describes one case of InGaAs growth on an InP substrate patterned with silicon nitride. The In concentration was much higher near the edges of the growth area than in the center. This means that the nominal lattice constant of material near the edges of the growth area was larger than that near the center. For growth on an etched mesa, the In concentration distribution may be the opposite, i.e., highest In concentration in the center. Many different effects may contribute to the nonuniformity. Thus, it may be possible to tailor the growth conditions to produce a favorable nonuniformity. For example, to grow a structure for a 1.3 μm VCSEL with an InGaAs active region on a GaAs substrate, it may be preferable to have the highest In concentration in the center. This In distribution would allow defect free growth on a mesa much larger than the diameter D described above. In the case of uniform In concentration, growth on a mesa much larger than D may result in misfit dislocations outside the diameter D, which may or may not affect performance or reliability. However, use of a more favorable In distribution may positively affect performance and/or reliability. The absence of dislocations, even outside of D, is likely to improve reliability. If the In concentration varies appreciably within the diameter D, improved carrier confinement may also improve performance, for example by reducing threshold current. For purposes of the following discussions, it is to be understood that the previously-defined terms "nominal lattice constant" and "grown lattice constant" refer to their average values over the diameter D, as defined. All following discussions are valid for uniform or nonuniform lattice constant distributions over the restricted growth area or over the area D, as defined. It is also within the scope of the invention to have nonuniform material compositions over the restricted growth area or over the area D, for example AlGaAs with varying Al and Ga concentrations.

Transition region 28 is now described in detail. The key aspect of transition region 28 is that the lattice constant variation parameter, κ, is kept below a "maximum" value which is determined solely by the lateral dimension of the growth area D and scaled by the substrate lattice constant. In FIGS. 2a, 2b, 2c, 2d 3a, and 3b, the Group-III atoms are shown as shaded circles and the group V atoms are shown as open circles. This discussion refers to numbers of Group-III atoms only and uses growth upon mesa 26 as the example. Mesa 26 is illustrated as 10 atoms wide for better visualization, but the discussion is generally valid for mesas n atoms wide where n may typically be 50,000 or more atoms. Given a mesa width of n atoms, then a monolayer of material may be grown with misfit of dislocations, so long as the material has a grown lattice constant differing from the substrate lattice constant by a sufficiently small amount, for example, on the order of 1/n. In a 10 atom wide mesa, the grown lattice constant may be different by $\frac{1}{10}$, or 10% but in a more practically-sized mesa, the difference is exceedingly small. As discussed above, it is important to distinguish between the nominal lattice constant and the grown lattice constant. Hereinafter, the grown lattice constant will refer to its final value after all layers are grown.

Following the growth of a layer with a grown lattice constant of $[1+(1/n)]$ times the substrate lattice constant, another layer may be grown, also without misfit dislocations, by increasing the grown lattice constant by the same factor. Thus the second layer has a grown lattice constant of $[1+(1/n)]^2$. In FIG. 2a, the first two layers of the transition region increase the grown lattice constant above the substrate lattice constant by a factor of $(^{11}/_{10})^2$. In general with such a construction, m atomic layers of a transition region may transition from a lattice constant L, to a new lattice constant $(L+\Delta L)$ by:

$$[1+(1/n)]^m = 1 + \Delta L/L \quad (3)$$

or more generally $$[1+(\kappa/n)]^m = 1 + \Delta L/L \quad (4)$$

where $\kappa$ may be positive or negative. The example in the preceding paragraph is for $\kappa=+1$, as is the illustration of FIG. 2a. In a preferred embodiment, the magnitude of $\Delta L/L$ will be greater than 0.001. For very large $|\kappa|$, misfit dislocations become highly probable, especially in the outer regions of mesa 26. These misfit dislocations may not present a problem in an operational device so long as they reside outside of the lateral dimension D on mesa 26. FIG. 2c shows a transition region with $\kappa=+2.0$. FIG. 2d shows a transition region where $\kappa=+0.5$. It should be appreciated that lower values of $|\kappa|$ decrease the likelihood of creating misfit dislocations, but it requires a thicker transition region 28. Additionally, the larger the $|\kappa|$ the greater the magnitude of taper for transition region 28. The condition $\kappa=0$ describes lattice-matched growth. Unless it forms part of a transition region, it is not considered as an inventive concept for this application because it does not achieve any change in grown lattice constant. It is also possible to have $\kappa$ vary within a transition region. A transition region may also comprise materials having any nominal lattice constant, including for example a layer of GaAsP in a transition region which grades from the GaAs lattice constant to a larger lattice constant. When $\kappa$ is negative, $\Delta L$ will also be negative and vice-versa. Unless otherwise stated, $\kappa$ is assumed to be +1.0 in all of the following discussions, however the discussions are generally valid for any value of $\kappa$.

The rate of variation in grown lattice constant specified by equation (4) is far smaller than in previous reports of graded-lattice-constant materials. The thickness, T, of the transition region required to transition from one lattice constant, L, to another given by $(L+|\Delta L|)$ is given by the number of monolayers of atoms required for the transition, m, multiplied by the average atomic monolayer spacing in the vertical direction $a_v$. From equation (3), m is easily calculated, yielding T:

$$ma_v = T = a_v ln[(|\Delta L|/L) - \kappa/n)] \quad (6)$$

Since $\Delta L/L$ and $\kappa/n$ are both $<<1$ for essentially all cases of interest, a linear approximation for the logarithmic function is valid. Thus:

$$T \approx a_v(n/\kappa)(|\Delta L|/L) \quad (7)$$

In most cases, e.g., the (001) oriented lattice illustrated in FIG. 2, the vertical atomic spacing equals the horizontal atomic spacing which determines the number of atoms, n, across mesa 26. Therefore, in these cases, the product of $a_v \cdot n$ is the average mesa diameter. Since the mesa diameter does not change significantly for reasonable changes in lattice constant a good and useful approximation is to use the original mesa diameter as D. Finally:

$$T \approx D(|\Delta L|/\kappa L) \quad (8)$$

It should be appreciated that a change of 7% or greater represents a large change in lattice constant. In a preferred embodiment, T is $\geq 30$ Å and D is $\geq 5$ μm. Hereinafter, equation (8) will be used to relate and establish the quantities contained therein. Therefore, $\kappa$ is hereinafter defined as:

$$\kappa = (D/T)(\Delta L/L) \quad (9)$$

Substrate orientation does have an effect on the inventive concept. The lattice constant and the atomic spacing are not the same, but the normalized changes will be the same, i.e., a 1% change in lattice constant will produce a 1% change in atomic spacing. While the lattice constant is independent of the lattice orientation, the atomic spacing does depend on lattice orientation. For certain substrate orientations, the horizontal and vertical atomic spacings will be different than for the (001) orientation illustrated in FIGS. 2a through 2d. For example, a (110) orientation, at a 45% angle in FIGS. 2a through 2d, has the horizontal atomic spacing reduced by the square root of two (1.414) compared to the (001) orientation, assuming both the Ga and As atoms are counted. Thus, the number of atoms across a given-sized mesa is increased by 1.414 and the change in grown lattice constant per monolayer is similarly reduced. However, the vertical atomic spacing is also reduced by 1.414. Thus 1.414 times more monolayers are required in the transition region, but each layer is 1.414 time thinner. The transition region therefore has the same thickness and the gradient in lattice constant with respect to thickness has the same value in either orientation. Equation (8) is independent of substrate orientation so long as the horizontal and vertical atomic spacings are the same. In a preferred embodiment, the substrate will have an orientation of between 0° and 4° off the (001).

Figure 6:
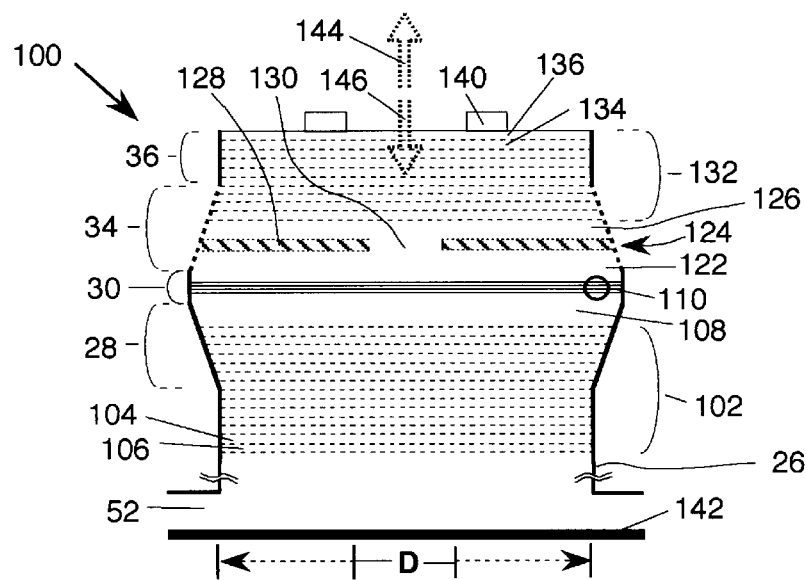
FIG. 6 is cross section of a VCSEL, LED, photodetector or EOM which incorporates the substrate and transition region of FIGS. 2a through 2d, 3a and 3b.

For the nominal case, $|\kappa|=1.0$, the thickness of transition region 28 is just the diameter D of mesa 26 (or for example maximum dimension of an active region) multiplied by the fractional change in lattice constant. To achieve a modest change in lattice constant of 1% on a 2" (D=50 mm a magnitude of $|\kappa|=18$) diameter substrate would require a transition region whose thickness is 1% of the substrate diameter, i.e., T=0.5 mm. To our knowledge this thickness is not predicted and certainly not with a gradient. Matthews & Blakeslee report growth achieving a $|\Delta L|/L=0.9\%$ change in lattice constant by grading over a thickness of 25 μm. For a 2 inch substrate (D=50 nm), this implies a $\kappa=18$. This data is plotted in FIG. 1b as point 22. However, a 1% change of lattice constant with $|\kappa|=1.0$ on a D=25 μm diameter mesa 26 requires only a 0.25 μm thick transition region 28. This thickness is practical and easily achieved by MBE, MOVPE, or any other widely-used epitaxial process. A D=25 μm diameter mesa 26 is sufficient for growth and fabrication of VCSELs as demonstrated, for other purposes, by Koyama et al. in *IEEE Photonics Technology Letters*, vol. 7, pp. 10–12 (1995). An illustration of a VCSEL constructed in accordance with the invention is illustrated in FIG. 6. Chin et al. reported a graded layer 2 μm thick in which the lattice constant changes by 3.8%. For a 2-inch (50 mm) diameter substrate, this implies D/T=2.5 $10^4$ and κ=950. This defines point 24 in FIG. 1b.

Figure 8:
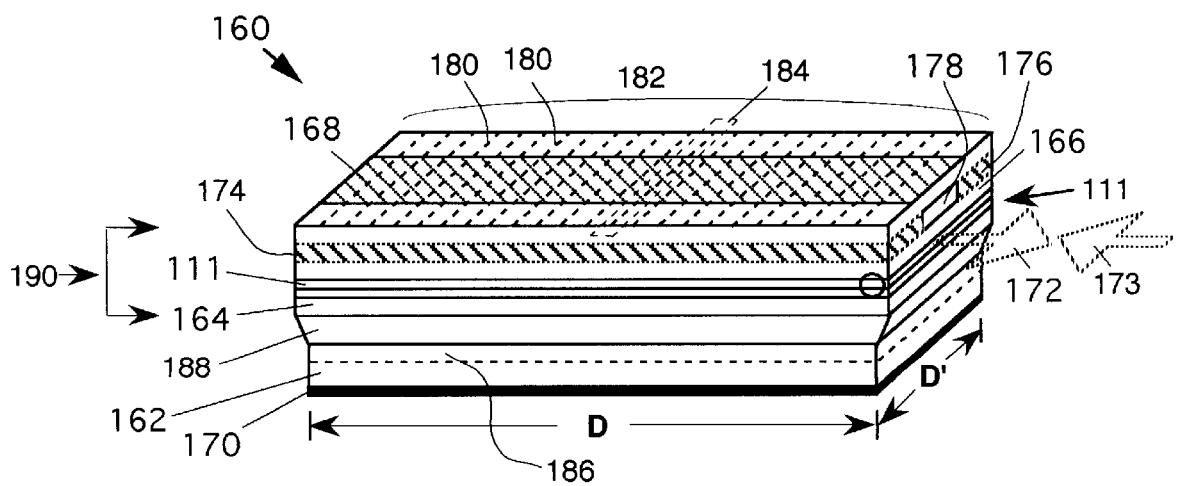
FIG. 8 is a cross section of an in-plane EEL, LED, photodetector or EOM which incorporates the substrate and transition region of FIGS. 2a through 2d, 3a and 3b, and the active region of FIG. 7.

For edge-emitting lasers, a length of D=250 μm or more is appropriate, implying a transition region 28 about 2.5 μm thick for |κ|=1.0 and magnitude of |ΔL|/L=1%. Such a thickness is still easily attainable, especially considering that much of the laser structure may be integrated into transition region 28 as illustrated in FIG. 8.

As previously mentioned, the grown lattice constant gradient in the transition region is extremely small. A 25 μm mesa of GaAs has about 88,500 Ga or As atoms across it. Thus, for |κ|=1, the first monolayer should mismatch from the GaAs lattice constant by $1.13 \times 10^{-5}$, and therefore would contain an In concentration of 0.000158, i.e., less than two hundredths of a percent. The structures reported by Fitzgerald et al. on the same diameter mesas have an abrupt change in In concentration of 0.05, i.e., more than 300 times higher. Larger dimension structures with |κ|=1 would have even smaller average lattice constant gradients. It should be appreciated that InAs has a 7.0164% larger lattice constant than GaAs. The grown lattice constant in transition region 28 is optimally an exponential as described by equation (5). However, the linear approximations made for equations (7) and (8) are reasonably accurate and are most useful for estimating thicknesses and gaining better understanding of the structures. With the linear approximation and the 25 μm GaAs mesa 26, the In concentration increases by 0.000158 in each succeeding monolayer for κ=1.0. While such control may be possible in advanced epitaxial reactors, it may be preferable to perform the growth in a simpler manner, for example in steps much larger than one monolayer but which are still sufficiently small as to not incur misfit dislocations. The In concentration changes by 1% about every 63 monolayers, or 178 Å. Thus a 1% In layer ($In_{0.01}Ga_{0.94a}$S) 178 Å thick may be grown, followed by a 2% In layer of the same thickness, followed by a 3% layer, and so on. Numerous variations on this approach may be employed, for example modifying the concentrations and/or thicknesses to better approximate the optimal exponential form. Furthermore, it is not necessary to have monotonic variation in the nominal or grown lattice constant. In a preferred embodiment, each layer may be grown below its respective critical thickness as calculated based upon the layer's nominal lattice constant and the grown lattice constant of the immediately underlying material.

Transition region 28, as described, only requires an average variation in grown lattice constant. Therefore, it should be appreciated the first few or last few layers forming transition region 28 may have lattice constants which are not consistent with the overall average variation of transition region 28. It is preferable for the first layer of transition region 28 to have a lattice constant close to that of mesa 26. But, it should be understood that this first layer or first few layers may have a lattice constant similar to the new lattice constant material 30 so long as this/these layer(s) does/do not effect the overall average variation in grown lattice constant in the transition region 28 to any great extent. Similarly, the last layer or layers of transition region 28, may have a lattice constant similar to mesa 26, instead of new lattice constant material 30. Similarly, any small regions within transition region 28 may have nominal lattice constants inconsistent with the overall grading of region 28. For example, having a lattice constant outside of the range of mesa 26 and new lattice constant material 30.

Other material variations which are normal parts of lasers may be straightforwardly integrated into transition region 28. Furthermore, strained layers (compressive and/or tensile) may be incorporated into transition region 28 and/or the new lattice constant region 30. For example, the primary envisioned use of this technique is to achieve, via highly-mismatched growth, extended wavelength laser operation on GaAs or on InP substrates. For this use, it is only the active region which requires the highly-mismatched material, and the active region is typically only about 50–1000 Å thick. For a detailed discussion on the use of strain compensation to increase critical thickness, see U.S. application Ser. No. 08/721,589 entitled "Extended Wavelength Strained Layer Lasers Having Strain Compensated Layers," filed Sep. 25, 1996, by the present inventor. This application is hereby incorporated by reference.

Turning now to FIG. 4, there is shown a graph of peak transition energy and peak transition wavelength v. lattice constant for a wide variety of semiconductor elements and compounds. It is to be understood that the specific values of these parameters are approximate and reported measurements vary. The approximate nature of the parameters does not detract from their use with the inventive concept. For some of the materials, e.g., ZnO, the lattice constant is the main parameter of interest and such materials are indicated by an arrow pointing to the lattice constant on the horizontal axis. In FIG. 4, the prefix c- refers to materials having a cubic or diamondlike crystal structure, while the prefix w- refers to a wurtzite or hexagonal crystal structure. Certain material systems of interest, for example (Al,Ga,In)N, may exist in either crystal structure. For (Al,Ga,In)N, the wurtzite structure is more common.

The (Al,Ga,In)N system is of particular interest here, and is also referred to as the III-N system since it comprises group-III elements with N being the group-V element. It exhibits direct transitions at wavelengths continuously ranging from the red (InN) to the ultraviolet (e.g. GaN). Blue LEDs for displays of various types and blue-to-ultraviolet semiconductor lasers for optical storage represent applications with very large commercial markets. However, there are no substrates of GaN, InN or AlN which are suitable for production epitaxial growth. Presently, most III-N devices are grown on substrates of crystalline aluminum oxide (sapphire or $Al_2O_3$) or SiC. In both cases the device growth is preceeded by growth of a buffer layer of AlN having a very high dislocation density and giving rise to high dislocation densities in the device structures. SiC has a lattice mismatch of about 1% from AlN and 3.6% from GaN. Thus, defect-free growth of III-N devices on SiC or aluminum oxide is not possible using the prior art techniques. Using the inventive restricted-area graded growth (RAGG) technique discussed above, a transition region from SiC to AlN may be accomplished in a thickness about 1% of the device dimension D. It is seen that SiC has a lattice constant smaller than AlN, thus the graded transition region should contain material having a lattice constant smaller than AlN, for example BAlN with small B concentrations which decrease to zero. From the "AlN platform", the transition region may be continued to any other desired lattice constant, for example to the lattice constant of GaN or of a desired InGaN. Another desirable substrate may be ZnO which has a lattice constant intermediate GaN and InN. For convenient reference, vertical dashed lines indicating the lattice constants of SiC and ZnO are included in FIG. 4.

It should be appreciated that there is no reason the lattice constants of binary materials such as GaN should be the optimum lattice constant on which to base a device structure. For example, for a blue-green laser emitting at 480 nm, the optimum active region material may be InGaN as indicated by filled circle 60 in FIG. 4.

Turning now to FIG. 5 there is shown a graph of peak transition energy and peak transition wavelength v. lattice constant for selected binary, ternary and quaternary group III–V semiconductor compounds having a cubic (zinc-blende) crystal structure. Of particular interest is the growth of extended wavelength lasers on GaAs, GaP and InP substrates, especially GaAs. The following discussions are also relevant for LEDs, photodetectors and EOMs. Additionally, the following discussions are relevant for optoelectronic devices on other substrates, including Si, any of the materials shown in FIGS. 4 and 5, or any other material. Si has a lattice constant of 5.431 Å, which differs by less than 0.04% from the 5.4512 Å lattice constant of GaP. By extrapolating in FIG. 1a the line defining the Limit for Unlimited "Critical Thickness," it is expected that GaP may be grown defect free on Si substrates for mesas having sizes approximately 200 μm or smaller, i.e., $D_{max}$ is about 200 μm.

Red-emitting lasers grown in GaAs substrates traditionally use InGaP or InAlGaP active materials which are either lattice-matched to GaAs or which are compressively strained. The compressive strain helps reduce threshold current density, however it requires use of a lower bandgap energy material thus the emission wavelength increases. For light in the 600–700 nm wavelength region the visibility of the light increases dramatically as the wavelength reduces. For example, 632 nm light is about 4.5 times as visible as 670 nm light. Most commercial visible semiconductor lasers emit in the 630–680 nm range and there is tremendous impetus to decrease the emission wavelength. The shorter wavelength lasers have much lower output power than longer wavelengths lasers. However, many applications also require high power, e.g., optical recording, printing and to a lesser extent barcode scanning.

The RAGG technique may be used to produce red-emitting lasers which have shorter wavelength and/or higher performance. The main performance characteristics of interest are maximum single-mode power and the stability of the operating characteristics over wide temperature ranges, especially at higher temperatures. The nominal InGaP material lattice matched to GaAs which emits at about 650 nm in the random alloy state is shown as filled circle 68 in FIG. 5. To confine carriers in the InGaP active region, the InGaP is clad by materials of higher bandgap (higher peak transition energy), for example InAlP shown as filled circle 70. Shorter-wavelength lasers are formed by use of thin quantum wells and/or adding aluminum, i.e., InAlGaP. InAlP lattice matched to GaAs is illustrated in FIG. 5 as filled circle 70. It has a shorter peak transition wavelength than the InGaP, however it has an indirect bandgap and is not suitable for lasing. An even shorter wavelength emission may be obtained by a judicious InAlGaP combination as shown as filled circle 72, however it also has an indirect bandgap.

Filled circle 74 represents an InGaP material with a lattice constant about 0.57% smaller than that of GaAs and which emits at about 600 nm. Growth of material 74 on a GaAs substrate would have significant tensile strain and a critical thickness about 300 Å. However, if material 74 were to be grown on top of a transition region, it could be grown without strain to arbitrarily large thickness. Alternatively, it could be grown with compressive strain, thereby reducing the threshold current densities for lasers. For D≈25 μm, the transition region would only have to be about 0.1425 μm thick (κ=−1.0) to achieve the −0.57% change in lattice constant. If material 74 is to be grown with compressive strain on a GaAs substrate, a more extensive transition region may be used, for example to achieve a change in lattice constant of about −1%. In a laser, material 74 would preferably be clad by materials of higher bandgap, for example InAlP material 76, InAlGaP material 78, or other materials in that region of FIG. 5. If material 74 is strained, strain compensation may be advantageously incorporated by having cladding materials of the opposite strain. It should be appreciated that material 74 is a specific example of a whole range of materials, including but not limited to InGaP and InAlGaP, which may favorably employ transition regions, constructed by the RAGG technique, to produce superior visible-emitting lasers or other optoelectronic devices. Any device, particularly lasers, which employ a RAGG transition region and any material in the vicinity of those discussed in the context of FIG. 5 are part of the invention described herein.

It may also be possible to produce lasers and other optoelectronic devices (OEDs) employing materials similar to material 74 on other substrates, for example GaP or Si. Both GaP and Si have lattice constants significantly smaller than materials in the vicinity of material 74. Thus, transition regions with κ>0 may be used. For VCSELs, it may be preferable to first use a transition region to the GaAs lattice constant, grow a mirror in the (Al,Ga)As system, grow a transition region as described in the preceeding paragraph, grow the active region, grow a second transition region back to the GaAs lattice constant, and then grow a second mirror. Combinations of some of these growth implementations may also be used.

Turning now to FIG. 3a, the case where κ=−1 is used to produce a new lattice constant which is smaller than the substrate lattice constant is illustrated. This structure may be useful, for example in producing red, orange, yellow, green or other wavelength emitting lasers on GaAs substrates as discussed above.

Another use of RAGG transition regions is to produce long-wavelength lasers and other OE devices on GaAs substrates. For example, lasers including VCSELs are desired in the 1.3–1.55 μm region for optical communications. Lasers and VCSELs at these and other wavelengths, especially longer wavelengths, are desired for spectroscopic sensing. It is possible and commercially viable to produce strained layer lasers on GaAs substrates which emit at wavelengths significantly longer than the GaAs emission wavelength of about 875 nm. For example, 980 nm strained InGaAs lasers are commercially important for pumping Erbium-doped fiber amplifiers. The peak transition energy for such lasers is about 150 meV lower than that of GaAs. Thus, conventional strain may be used to produce reliable InGaAs lasers with an emission wavelength equivalent to at least 150 meV below that of the substrate platform on which they are produced. A bar 150 meV in height is illustrated in FIG. 5 as reference numeral 69. Bar 69 extends from the GaAs location vertically downward to reach the 0.98 μm emission wavelength level. It is important to appreciate that strain compensation or other techniques may be employed to extend the emission wavelength even further for reliable structures. The reliable 1.06 μm strain-compensated laser grown on GaAs has a peak transition energy about 250 meV lower than that of GaAs. Although the following discussion is based on a 150 meV drop, it is valid for larger or smaller drops which may or may not utilize other techniques, for example strain compensation or any other technique known to lower peak transition energy.

On a GaAs substrate, a transition region may be grown to reach the lattice constant of about 5.73 Å, indicated by location 80. A 150 meV drop from location 80 corresponds to a peak transition wavelength of 1.3 μm. Thus, a 1.3 μm laser or other OED may be produced on top of such a transition region. Location 80 corresponds to a lattice mismatch of about 1.35% from GaAs and therefore may be terminated by (In,Al,Ga)As with about 19% In. It may alternatively be terminated with any other material having a lattice constant close to this, for example InGaP. The vertical dashed line through location 80 in FIG. 5 indicates other ternary materials having this lattice constant.

On a GaAs substrate, a transition region may be grown to reach the lattice constant of about 5.78 Å, indicated by location 84. A 150 meV drop from location 84 corresponds to a peak transition wavelength of 1.55 μm. Thus a 1.55 μm laser or other OED may be produced on top of such a transition region. Location 84 corresponds to a lattice mismatch of about 2.23% from GaAs and therefore may be terminated by (In,Al,Ga)As with about 31% In. It may alternatively be terminated with any other material having a lattice constant close to this, for example InGaP. The vertical dashed line through location 84 in FIG. 5 indicates other ternary materials having this lattice constant.

On a GaAs substrate, a transition region may be grown to reach the lattice constant of about 5.94 Å, indicated by location 88. A 150 meV drop from location 80 corresponds to a peak transition wavelength of 3.1 μm. Thus, a 3.1 μm laser or other OED may be produced on top of such a transition region. Location 88 corresponds to a lattice mismatch of about 5% from GaAs and therefore may be terminated by (In,Al,Ga)As with about 71% In. It may alternatively be terminated with any other material having a lattice constant close to this, for example InGaP. The vertical dashed line through location 88 in FIG. 5 indicates other ternary materials having this lattice constant. Alternatively, location 88 may be reached via a transition region starting from an InP substrate. The 5.94 Å lattice constant differs only by about 1.2% from the 5.869 Å lattice constant of InP; thus the transition region may be much thinner than the one grown on GaAs.

A very specific example of how prior art teaching may be used in combination the invention is now presented. Ishikawa has proposed in *IEEE Photonics Technology Letters*, vol. 6, pp. 344–347, 1994, the use of ternary substrates of $In_{0.26}Ga_{0.74}As$ for producing 1.3 μm lasers with superior temperature characteristics. Ternary substrates are the subject of research activities, but are not generally available in large quantity or size or at low cost. The inventive technique described herein may be used to produce equivalent lasers on GaAs substrates. The top of the transition region may be considered to be a "micro-substrate" on which device structures may be grown. To mimic the laser proposed by Ishikawa, transition region 28 should end with the lattice constant of $In_{0.26}Ga_{0.74}As$. Since it differs from that of GaAs by about 1.8%, a 250 μm long mesa 26 requires a transition region 28 about 4.5 μm thick for κ=1.0. Ishikawa's laser structure may be grown on top of this "micro-substrate." The total growth time and thickness may be favorably reduced however by integrating all or much of the bottom part of the laser structure into transition region 28. Here, the "bottom" part refers to the part of the laser below the active region, see FIGS. 6 and 8. Thus, while maintaining a grown lattice constant variation in accordance with equation (5), the actual materials may vary, e.g., between InGaAs and InAlGaAs to optimize carrier confinement. The active region and succeeding material may be grown following the Ishikawa design or any other semiconductor laser design known in the prior art. Some differences may still remain between the inventive structure and that proposed by Ishikawa. The exact composition of the active layers may need to be different in order to achieve the same emission wavelength or the same amount of compressive strain. This is an inconsequential difference and is a mere matter of design choice. Numerous variations on this design are within the scope of the present invention so long as the RAGG technique is utilized to construct a transition region for lattice matching two semiconductor materials having different lattice constants.

A VCSEL having an active region similar to that proposed by Ishikawa may also be formed. On a 25 μm mesa 26, a 0.45 μm thick transition region 28 could be grown (κ=1.0), followed by the VCSEL structure having ternary InGaAs mirrors. Since the transition region is not very thick, the bottom mirror may comprise instead, for example, GaAs/AlAs layers throughout its structure. Following the bottom mirror, a 0.45 μm thick transition region 28 to $In_{0.26}(AlGa)_{0.74}As$ with appropriate confinement structure may be grown. An active region is then grown. The active region would likely comprise compressively strained quantum wells, compressively strained even relative to the new lattice constant. Furthermore the quantum well may comprise superlattices and/or employ strain compensation and/or comprise nitrogen. If superlattices are utilized, the lattice layers will preferably differ in at least one constituent element by at least 15%. Then a second transition region to the (AlGa)As lattice constant may be grown having similar thickness with confinement structure. Finally, a top mirror of GaAs/AlAs may be grown. Processing of the VCSEL would be much as for ordinary VCSELs and there is no issue of cleaving. Many alternatives are available. The top of the VCSEL including the top mirror could comprise material matched to $In_{0.26}Ga_{0.74}As$ eliminating the need for the second transition region. Or the transition region could begin within the bottom mirror near its top, and the second transition region if present could extend into the lower portion of the top mirror. FIG. 4a illustrates a VCSEL with two transition regions, each extending partially into a mirror structure.

Additionally, other techniques may be used to grow semiconductor laser structures in conjunction with the invention. For example, short period superlattices may be utilized, see U.S. application Ser. No. 08/721,769 entitled "Extended Wavelength Strained Layer Lasers Having Short Period Superlattices," filed Sep. 25, 1996. This application is hereby incorporated by reference. Another technique would include the use of nitrogen in the semiconductor laser, see U.S. application Ser. No. 08/721,590 entitled "Extended Wavelength Strained Layer Lasers Having Nitrogen Disposed Therein," filed Sep. 25, 1996. This application is hereby incorporated by reference. Yet another technique would include the use of strained layers in the semiconductor laser, see U.S. application Ser. No. 08/721,589 entitled "Extended Wavelength Strained Layer Lasers Having Strain Compensated Layers," filed Sep. 25, 1996. This application is hereby incorporated by reference.

FIG. 3b illustrates a structure with 2 transition regions, exemplified by the VCSEL structure described above. In this situation, the first transition region 28 has κ=1 and the second transition region 34 has κ=−1. A second new lattice constant region 36 is grown above second transition region 34. The use of this embodiment with a VCSEL is illustrated in FIG. 4a, discussed below.

The restricted-area gradient growth described above has the enormous potential to grow unlimited thicknesses of highly-mismatched materials on device-sized regions without incurring misfit dislocations in central portions 32. As discussed above, central portions 32 will have a lateral dimension D which may or may not correspond to the full lateral extent of mesa 26. The tops of transition regions 28, 34 may be regarding as "micro-substrates," similar to ternary substrates, on which material may be grown in combinations previously not possible. It makes possible the growth of lasers on GaAs substrates which emit at $\geq 1.3\,\mu m$, 1.55 $\mu m$, or even longer wavelengths. Similarly, lasers may be fabricated on InP substrates which emit at >2.2 $\mu m$, 2.7 $\mu m$, or even much longer wavelengths. Lasers emitting at 2.7 $\mu m$ or even longer may even be produced on GaAs substrates. Growth conditions may need to be optimized so that material does not migrate in either direction between edges and tops of mesa 26, which could interfere with the top surface growth.

It is also possible to form pseudomorphic "ternary substrates" by grading over very large thicknesses. For $|\kappa|=1.0$ and a 2" diameter substrate, a 1% change in lattice constant may be achieved over a 500 $\mu m$ thick transition region. While 500 $\mu m$ is rather large, nongraded epitaxial layers in excess of 100 $\mu m$ are produced in the art. For example, 100 $\mu m$ thick AlGaAs layers are produced on GaAs substrates to provide transparent "substrates" on which high-efficiency LEDs are grown. On similarly thick AlGaAs layers, 850 nm "bottom emitting" VCSELs have been fabricated, see Kohama et al., "0.85 $\mu m$ Bottom-Emitting Vertical-Cavity Surface-Emitting Laser Diode Arrays Grown on AlGaAs Substrates," *Electronics Letters*, vol. 30 (August 1994), pp. 1406–1407. In both cases, the GaAs substrate is eventually removed; the reason for producing the thick AlGaAs layer is to provide a transparent "substrate" for the processed devices in order to handle them. However, the same 100 $\mu m$ thickness could provide a ±0.2% change in lattice constant for $|\kappa|=1.0$ and a 2" diameter substrate. Even such a small change could produce significant device improvements for some applications. In particular, a −0.2% change in lattice constant from that of GaAs could provide large performance improvements in visible-emitting EELs and VCSELs. For these applications it is not necessary and probably not desirable to remove the original GaAs substrate. Larger changes in lattice constant may be produced with larger $|\kappa|$ and/or thicker transition regions. Such thick transition regions may be grown preferably by liquid phase epitaxy or by high growth rate MOCVD. The same practice may be applied to larger substrates using larger $|\kappa|$ and/or thicker transition regions. Furthermore, macroscopic or mesoscopic-sided regions, e.g., 100 $\mu m$–1000 $\mu m$ across, may be patterned to form restricted-area growth surfaces on which much thinner pseudomorphic transition regions may be grown.

Devices

Turning now to FIG. 6, a cross section of a VCSEL which incorporates the inventive teachings illustrated FIGS. 2a through 2d, 3a and 3b, is shown. For clarity, like elements have been provided with like reference numerals except that a prime has been added to each reference numeral where there is a slight difference in the particular element in this embodiment. The following discussion will focus on the differences between the elements of this embodiment and that of the preferred embodiment.

Device 100 is preferably a vertical cavity surface emitting laser (VCSEL), but it may also be a LED, photodetector or EOM. Device 100 may be grown on substrate 52 having a mesa 26. It is to be understood that mesa 26 is a region of selected area growth and may be defined by any of the means discussed previously or by any other means. This use of the term "mesa" holds for discussions of devices in succeeding Figures as well. Bottom mirror 102, if present, comprises high-index layers 104 and low-index layers 106 and is grown on mesa 26. On bottom mirror 102 is grown bottom spacer 108. As may be seen, bottom mirror 102 is preferably formed on mesa 26 and may be at least partially in transition region 28. It should be appreciated that mirror 102 may also be partially disposed in mesa 26. As illustrated, transition region 28 is characterized by $\kappa>0$. Furthermore, any of the transition regions illustrated in FIGS. 2a through 2d, 3a and 3b may be present in any part of device 100.

Figure 7:
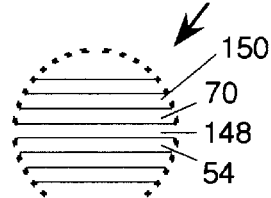
FIG. 7 is an exploded view of the active region of FIG. 6 and FIGS. 8 through 15.

The first new lattice constant region 30 may contain active region 110. A detailed discussion of active region 110 is provided below and is illustrated in FIG. 7. Next, the second transition region 34 partially contains a top spacer 122, and partially contains a layer forming a lens and/or aperture 124 and optional spacer 126. For details on specific lenses and/or apertures and their formation, please refer to is U.S. application Ser. No. 08/574,165, entitled "Conductive Element with Lateral Oxidation Barrier," filed Dec. 18, 1995; U.S. application Ser. No. 08/659,942, entitled "Light Emitting Device Having an Electrical Contact Through a Layer containing Oxidized Material," filed Jun. 7, 1996; U.S. application Ser. No. 08/686,489 entitled "Lens Comprising at Least One Oxidized Layer and Method for Forming Same," filed Jul. 25, 1996; and U.S. application Ser. No. 08/699,697 entitled "Aperture comprising an Oxidized Region and a Semiconductor Material," filed Aug. 19, 1996; U.S. application Ser. No. 08/796,111 entitled "Intra-Cavity Lens Structures for Semiconductor Lasers," filed Feb. 7, 1997. These applications are hereby incorporated by reference.

Lens and/or aperture 124 has outer segments 128 which do not conduct current and may be oxidized and an inner channel 130 which conducts current and may be non-oxidized. Lens and/or aperture 124 may also be formed, for example, by ion implantation, in which case outer segments 128 may correspond to the implanted regions. On top of lens and/or aperture 124 may be a top mirror 132 comprising low-index layers 134 and high-index layers 136. Bottom mirror 102 may preferably comprise alternating semiconductor layers such as GaAs or AlGaAs for layers 104 and AlAs or AlGaAs for layers 106. If substrate 52 comprises InP, bottom mirror 102 may preferably comprise alternating semiconductor and oxidized layers, such as InGaAs or InP for layers 104 and an oxide for layers 106. Top mirror 132 may comprise similar materials as bottom mirror 102, or may alternatively comprise dielectric materials. Finally, top and bottom electrical contacts 140, 142 are disposed on respective surfaces of top mirror 132 and substrate 52. If top mirror 132 is not present, top electrical contact 140 is preferably disposed on spacer 126 As illustrated, top mirror 132, if present, should be conductive to electrical current. Alternatively, top mirror 132 may be non-conductive, in which case electrical contact 140 should be disposed below top mirror 132. Additionally, optional isolation regions (not shown) may be provided which may be formed by ion implantation. If device 100 is a light emitter such as a VCSEL or LED, light beam 144 emits preferably out the top, for example through top mirror 132. Alternatively, light beam 144 may emit out the bottom, for example through substrate 52. If device 100 is a photodetector or EOM, incident beam 146 is incident preferably in through the top, for example through top mirror 132. Alternatively, incident beam 146 may be incident through the bottom, for example through substrate 52.

A preferred embodiment of device 100 is a VCSEL which has GaAs for substrate 52, GaAs, AlAs layers for bottom mirror 102, a transition region 28 with $\kappa>0$ and comprising InGaAs, an InGaAs active region 110 which emits light beam 144 at 1.3 $\mu$m or longer wavelength, a second transition region 34 with $\kappa<0$, and a top mirror 132 comprising GaAs and AlAs.

Another preferred embodiment of device 100 is a surface-emitting LED which has SiC or $Al_2O_3$ for substrate 52, and a transition region 28 with $\kappa>0$. Transition region 28 may comprise BAlN with decreasing B until the lattice constant of AlN is reached, after which transition region 28 preferably comprises AlGaN, InAlN, or a combination therof. Active region 110 may comprise InGaN which emits light beam 144 at 0.6 $\mu$m or shorter wavelength, for example ~0.46 $\mu$m. Device 100 may alternatively be fabricated with appropriate mirror structures and operated as a VCSEL.

Turning now to FIG. 7, an exploded view of active region 110 is illustrated. This particular quantum well structure illustrates multiple quantum wells. It should be appreciated that active region 110 may have only one quantum well. The advantage of having multiple quantum wells is that for a given electron-hole volumetric density, the optical gain is increased. For convenience, quantum well 148 is constructed in a similar manner as quantum well 150. It should be appreciated that within invention, quantum well 148 may be different than quantum well 150. For example, differently structured quantum wells 148 and 150 may be used advantageously to increase thermal stability and/or extend tuning range. Barriers or confining layers 54 and 70 are disposed on either side of quantum well 148, 150. It should be appreciated that the quantum wells 148, 150 are constructed as described by the numerous techniques or combinations thereof. For example, quantum wells 148, 150 may be strain compensated, formed from superlattices or may contain small amounts of nitrogen therein. For a detained discussion on modifications to the active region, the reader is referred to U.S. application Ser. No. 08/721,589 entitled "Extended Wavelength Strained Layer Lasers Having Strain Compensated Layers," filed Sep. 25, 1996. This application is hereby incorporated by reference. It should be appreciated that these techniques are utilized in combination with high In concentrations to reduce the peak transition energy of a device, having a GaAs substrate, to allow for example, an emission wavelength of 1.3 $\mu$m or longer. Thus, the quantum wells 148, 150 may be: (1) superlattice structures as discussed in the above identified co-pending U.S. patent application Ser. No.: 08/721,769; (2) may be strain compensated as discussed in the above identified co-pending U.S. patent application Ser. No.: 08/721,589; (3) may incorporate nitrogen in the active layer as discussed in the above identified co-pending U.S. patent application Ser. No.: 08/721,590; (4) may be provided with a particular orientation as determined by the orientation of substrate 52 as discussed in the above identified co-pending U.S. patent application Ser. No. 08/721,589; and/or (5) operated at an elevated or reduced temperature as discussed in the above identified co-pending U.S. patent application Ser. No. 08/721,589. Furthermore, light emitting device 100 may utilize gain offset as discussed in the above identified co-pending U.S. patent application Ser. No. 08/721,589. For brevity, individual combinations are not discussed. The elements of active region 110 discussed herein also apply to active regions 111, 112, 113, 114, 115, 116, 117, and 118 in succeeding Figures. But, it should be appreciated that this application contemplates any combination which increases the emission wavelength to 1.3 $\mu$m or above for a GaAs substrate. Finally, it should be appreciated that any technique discussed above may be utilized with known techniques to lower the emission wavelength if desired.

A brief summary of the above referenced patent applications will be discussed in conjunction with the inventive concepts of this invention.

To grow an increased-thickness compressively strained quantum well, a layer of tensely-strained material is grown first. Then, when the compressively-strained layer is grown to its nominal CT, the accumulated strain of the tensely-strained layer is subtracted from the accumulated strain in the well, reducing the forces which generate misfit dislocations. To a first approximation, a compressively-strained layer may be grown to about twice its nominal critical thickness before the accumulated strain force is once again at the level which will form dislocations. Finally, a second oppositely-strained layer is grown over the quantum well to bring the accumulated strain once again to approximately zero.

Nitrogen may be utilized a constituent element in the active region. Additionally, the operation temperature may be modified above or below 300 K. Or a superlattice structure comprising at least two strained layers and a third layer disposed therebetween may be utilized to form the active region or layer.

These techniques may be utilized independently or in combination and are provided as examples of additional contemplated modifications to the inventive concept of this application.

It should be appreciated that merely a few examples of VCSEL structures have been described. This description is merely illustrative and should in no way be viewed as limiting the invention to this particular structure. For example, the location(s) and extent(s) of the transition region(s) may vary widely. For a description of other VCSEL structures which are contemplated by the invention, please refer to FIGS. 5a through 5f of U.S. patent application Ser. No. 08/574,165 by Jewell. This application further includes other VCSEL structures including but not limited to ion implanted VCSELs and other forms of VCSELs having oxide-defined apertures which may be used in conjunction with the inventive teachings of this application and is hereby incorporated by reference. It should be appreciated that the inventive concept provides a "micro substrate" on which conventional VCSEL and other opto-electronic or electronic components may be grown or incorporated as taught in FIGS. 6, and 8 though 15.

Turning now to FIG. 8, a cross section of an edge emitting laser or LED (also termed in-plane laser or in-plane LED) or EOM or photodetector, which incorporates the inventive teachings illustrated FIGS. 2a through 2d, 3a and 3b, is shown. Device 160 which incorporates elements such as substrate 162, first cladding layer 164, active region 111, second cladding layer 166, top contact 168 and bottom contact 170. In response to a current flow, device 160 may emit a beam of light, for example light beam 172 as in an edge-emitting laser. Alternatively, if device 160 is a photodetector or EOM, device 160 may detect or modulate incident light beam 173. Additionally, a current blocking layer 174 may be present which may comprise a partially oxidized layer. Layer 174 may have outer segments 176 which do not conduct current and may be oxidized and an inner channel 178 which conducts current and may be non-oxidized. For a detailed discussion on layer 174, the reader is referred to U.S. patent application Ser. No. 08/574, 165 by Jewell. Optionally, grating lines 180 may extend partially or completely across device 160 to form grating 182. Such gratings on an in-plane laser may form a distributed feedback laser (DFB) laser or a distributed Bragg reflector (DBR) laser. A further option is phase shift region 184 in which grating lines 180 are shifted, typically by one quarter wave, to form a phase shifted DFB laser.

Mesa 186 is illustrated as being on substrate 162 and the same size thereof. It should be appreciated that substrate 162 may have a lateral extent which is greater than mesa 186 and is only illustrated for convenience as being the same. Transition region 188 is illustrated as being similar to that of FIG. 2a. As illustrated, transition region 188 is characterized by κ>0. Cladding layer 164 is grown above first transition region 188 and in the first new lattice constant material 190. It should be appreciated that cladding layer 164 may also be disposed in first transition region 188. The active region 111 is disposed in the first new lattice constant material 190. Finally, the remaining structure is grown in the first new lattice constant material 190. It should be appreciated that any of the structures illustrated in FIGS. 2a through 2d, 3a and 3b or any combinations thereof, are contemplated for use with this inventive concept. Furthermore, any of the transition regions illustrated in FIGS. 2a through 2d, 3a and 3b may be present in any part of device 160.

An exemplary embodiment of device 160 is an edge-emitting laser which has GaAs for substrate 162, a transition region 188 with κ>0 and comprising InGaAs, and an InGaAs active region 111 which emits light beam 172 at 1.3 μm or longer wavelength.

Another exemplary embodiment of device 160 is an edge-emitting laser which has SiC or $Al_2O_3$ for substrate 162, and a transition region 188 with κ>0. Transition region 188 may comprise BAlN with decreasing B until the lattice constant of AlN is reached, after which transition region 188 preferably comprises AlGaN, InAlN, or a combination thereof. Active region 111 may comprise InGaN which emits light beam 172 at 0.6 μm or shorter wavelength, for example ~0.46 μm. Device 160 may alternatively be operated as an LED.

Figure 9:
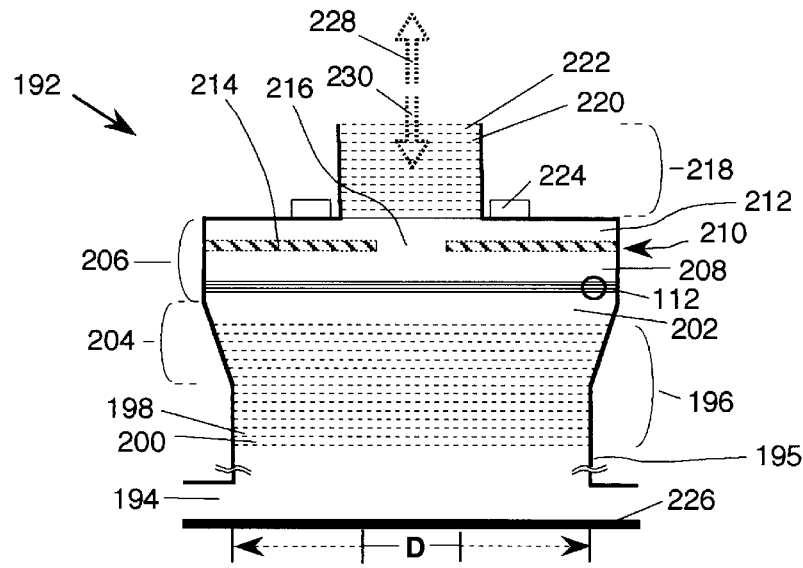
FIG. 9 is a cross section of an alternate embodiment of a VCSEL, LED, photodetector or EOM which incorporates the substrate and transition region of FIGS. 2a through 2d, 3a and 3b, and the active region of FIG. 7.

Turning now to FIG. 9, an alternative device structure is shown which incorporates the inventive concept. Device 192 is preferably a VCSEL, but it may also be a LED, photodetector or EOM. Device 192 may be grown on substrate 194 having a mesa 195. It is to be understood that mesa 194 is a region of selected area growth and may be defined by any of the means discussed previously or by any other means. Bottom mirror 196, if present, comprises high-index layers 198 and low-index layers 200 and is grown on mesa 194. On mesa 194 or bottom mirror 196 is grown bottom spacer 202. It should be appreciated that mirror 196 may be partially disposed in mesa 194 and/or in transition region 204. As illustrated, transition region 204 is characterized by κ>0 however it is also possible to have κ<0. Furthermore, any of the transition regions illustrated in FIGS. 2a through 2d, 3a and 3b may be present in any part of device 100.

The first new lattice constant region 206 may contain active region 112. A detailed discussion of active region 112 is provided above and is illustrated in FIG. 7. Above active region 112 are second spacer 208, a layer forming a lens and/or aperture 210 and optional spacer 212. Lens and/or aperture 210 has outer portion(s) 214 which does not conduct current and may be oxidized and an inner channel 216 which conducts current and may be non-oxidized. Lens and/or aperture 210 may also be formed, for example, by ion implantation, in which case outer segments 214 may correspond to the implanted regions. On top of lens and/or aperture 210 may be a top mirror 218 comprising low-index layers 220 and high-index layers 222. Bottom mirror 196 may preferably comprise alternating semiconductor layers such as GaAs or AlGaAs for layers 198 and AlAs or AlGaAs for layers 200. If substrate 194 comprises InP, bottom mirror 196 may preferably comprise alternating semiconductor and oxidized layers, such as InGaAs or InP for layers 198 and an oxide for layers 200. Top mirror 132 may comprise similar materials as bottom mirror 102, or may alternatively comprise dielectric materials. Finally, top and bottom electrical contacts 224, 226 are disposed on respective surfaces of spacer 212 and substrate 194. As illustrated, top mirror 132, if present, does not need to be conductive to electrical current. Additionally, optional isolation regions (not shown) may be provided which may be formed by ion implantation. If device 192 is a light emitter such as a VCSEL or LED, light beam 228 emits preferably out the top, for example through top mirror 218. Alternatively, light beam 228 may emit out the bottom, for example through substrate 194. If device 192 is a photodetector or EOM, incident beam 230 is incident preferably in through the top, for example through top mirror 218. Alternatively, incident beam 230 may be incident through the bottom, for example through substrate 194.

A preferred embodiment of device 192 is a VCSEL which has GaAs for substrate 194, GaAs/AlAs layers for bottom mirror 196, a transition region 204 with κ>0 and comprising InGaAs, an InGaAs active region 112 which emits light beam 228 at 1.3 μm or longer wavelength, and a top mirror 218 comprising dielectric materials.

Another preferred embodiment of device 192 is a VCSEL which has GaAs for substrate 194, AlGaAs/AlAs layers for bottom mirror 196, a transition region 204 with κ<0 and comprising[In,Al,Ga] [As,P], an [In,Al,Ga]P active region 112 which emits light beam 228 at 0.7 μm or shorter wavelength, and a top mirror 218 comprising dielectric materials.

Yet another preferred embodiment of device 192 is a surface-emitting LED which has SiC or $Al_2O_3$ for substrate 194, and a transition region 204 with κ>0. Transition region 204 may comprise BAlN with decreasing B until the lattice constant of AlN is reached, after which transition region 204 preferably comprises AlGaN, InAlN, or a combination thereof. Active region 112 may comprise InGaN which emits light beam 144 at 0.6 μm or shorter wavelength, for example ~0.46 μm. Device 192 may alternatively be fabricated with appropriate mirror structures and operated as a VCSEL.

Figure 10:
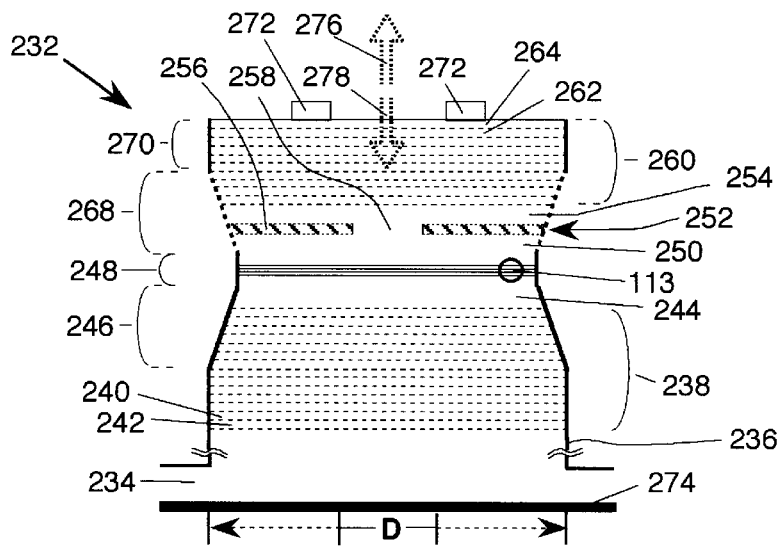
FIG. 10 is a cross section of an alternate embodiment of a VCSEL, LED, photodetector or EOM which incorporates the substrate and transition region of FIGS. 2a through 2d, 3a and 3b, and the active region of FIG. 7.

Turning now to FIG. 10, an alternative device structure is shown which incorporates the inventive concepts. Device 232 is preferably a VCSEL, but it may also be a LED, photodetector or EOM. Device 232 may be grown on substrate 234 having a mesa 236. It is to be understood that mesa 236 is a region of selected area growth and may be defined by any of the means discussed previously or by any other means. Bottom mirror 238, if present, comprises high-index layers 240 and low-index layers 242 and is preferably grown on mesa 236. On mesa 236 or bottom mirror 238 is grown bottom spacer 244. It should be appreciated that mirror 238 may be partially disposed in mesa 236 and/or in transition region 246. As illustrated, transition region 246 is characterized by κ<0. Furthermore, any of the transition regions illustrated in FIGS. 2a through 2d, 3a and 3b may be present in any part of device 232.

The first new lattice constant region 248 may contain active region 113. A detailed discussion of active region 113 is provided above and is illustrated in FIG. 7. Above active region 113 are second spacer 250, a layer forming a lens and/or aperture 252 and optional spacer 254. Lens and/or aperture 252 has outer portion(s) 256 which does not conduct current and may be oxidized and an inner channel 258 which conducts current and may be non-oxidized. Lens and/or aperture 252 may also be formed, for example, by ion implantation, in which case outer segments 256 may correspond to the implanted regions. On top of lens and/or aperture 252 may be a top mirror 260 comprising low-index layers 262 and high-index layers 264. Device 232 may have optional second transition region 268 and furthermore may have a second new lattice constant region 270. In a preferred embodiment, second new lattice constant region 270 as a lattice constant close to that of substrate 234. Bottom mirror 238 may preferably comprise alternating semiconductor layers such as GaAs or AlGaAs for layers 240 and AlAs or AlGaAs for layers 242. If substrate 234 comprises InP, bottom mirror 238 may preferably comprise alternating semiconductor and oxidized layers, such as InGaAs or InP for layers 240 and an oxide for layers 242. Top mirror 260 may comprise similar materials as bottom mirror 236, or may alternatively comprise dielectric materials. Finally, top and bottom electrical contacts 272, 274 are disposed on respective surfaces of top mirror 260 and substrate 234. If top mirror 260 is not present, top electrical contact 272 is preferably disposed on spacer 254. As illustrated, top mirror 260, if present, should be conductive to electrical current. Alternatively, top mirror 260 may be non-conductive, in which case electrical contact 272 should be disposed below top mirror 260. Additionally, optional isolation regions (not shown) may be provided which may be formed by ion implantation. If device 232 is a light emitter such as a VCSEL or LED, light beam 276 emits preferably out the top, for example through top mirror 260. Alternatively, light beam 276 may emit out the bottom, for example through substrate 234. If device 232 is a photodetector or EOM, incident beam 278 is incident preferably in through the top, for example through top mirror 260. Alternatively, incident beam 278 may be incident through the bottom, for example through substrate 234.

A preferred embodiment of device 232 is a VCSEL which has GaAs for substrate 234, AlGaAs/AlAs layers for bottom mirror 238, a transition region 246 with κ<0 and comprising (In,Al,Ga)(As,P), an (In,Al,Ga)P active region 113 which emits light beam 144 at 0.7 μm or shorter wavelength, a second transition region 268 with κ>0, and a top mirror 260 comprising AlGaAs and AlAs.

Yet another exemplary embodiment of device 232 is a surface-emitting LED which has Si for substrate 234, and a transition region 246 with κ<0. Transition region 246 may comprise cubic InAsN with decreasing As until the lattice constant of cubic InN is reached, after which transition region 246 may continue preferably comprising cubic InGaN, InAlN, or a combination therof. Transition region 246 may also comprise any materials, preferably in the (In,Al,Ga)(As,P,N) system. Active region 113 may comprise cubic InGaN which emits light beam 276 at 0.6 μm or shorter wavelength, for example ~0.53 μm. Device 232 may alternatively be fabricated with appropriate mirror structures and operated as a VCSEL.

Figure 11:
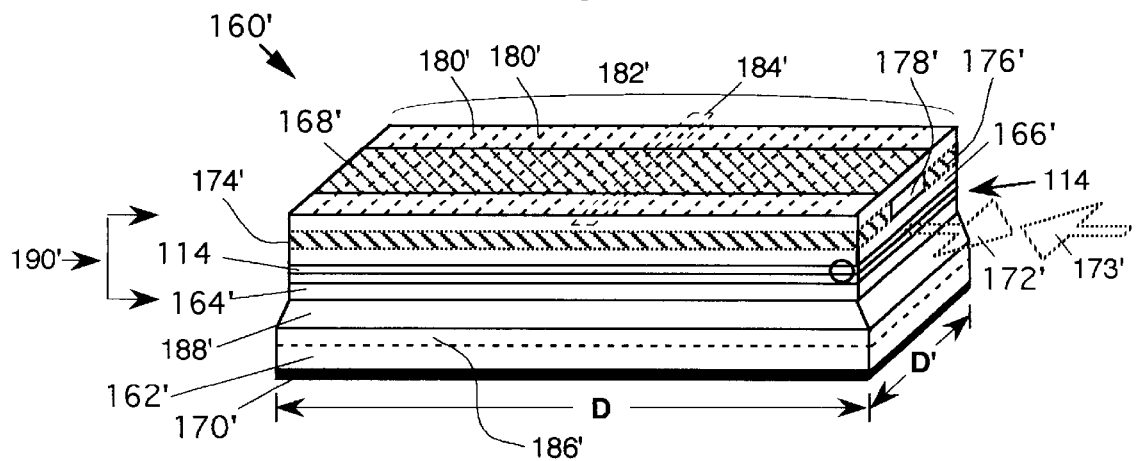
FIG. 11 is a cross section of an in-plane EEL, LED, photodetector or EOM which incorporates the substrate and transition region of FIGS. 2a through 2d, 3a and 3b, and the active region of FIG. 7.

Turning now to FIG. 11, a cross section of an edge emitting laser or LED (also termed in-plane laser or in-plane LED) or EOM or photodetector, which incorporates the inventive teachings illustrated FIGS. 2a through 2d, 3a and 3b, is shown. Device 160' which incorporates elements such as substrate 162', first cladding layer 164', active region 114, second cladding layer 166', top contact 168' and bottom contact 170'. In response to a current flow, device 160' may emit a beam of light, for example light beam 172' as in an edge-emitting laser. Alternatively, if it is a photodetector or EOM, device 160' may detect or modulate incident light beam 173'. Additionally, a current blocking layer 174' may be present which may comprise a partially oxidized layer. Layer 174' may have outer segments 176' which do not conduct current and may be oxidized and an inner channel 178' which conducts current and may be non-oxidized. For a detailed discussion on layer 174', the reader is referred to U.S. patent application Ser. No. 08/574,165 by Jewell. Optionally, grating lines 180' may extend partially or completely across device 160' to form grating 182'. Such gratings on an in-plane laser may form a distributed feedback laser (DFB) laser or a distributed Bragg reflector (DBR) laser. A further option is phase shift region 184' in which grating lines 180' are shifted, typically by one quarter wave, to form a phase shifted DFB laser.

Mesa 186' is illustrated as being on substrate 162' and the same size thereof. It should be appreciated that substrate 162' may have a lateral extent which is greater than mesa 186' and is only illustrated for convenience as being the same. Transition region 188' is illustrated as being similar to that of FIG. 3a. As illustrated, transition region 188' is characterized by κ<0. Cladding layer 164' is grown above first transition region 188' and in the first new lattice constant material 190'. It should be appreciated that cladding layer 164' may also be disposed in first transition region 188'. The active region 114 is disposed in the first new lattice constant material 190'. As illustrated, the remaining structure is grown in the first new lattice constant material 190'. It should be appreciated that any of the structures illustrated in FIGS. 2a through 2d, 3a and 3b or any combinations thereof, are contemplated for use with this inventive concept. Furthermore, any of the transition regions illustrated in FIGS. 2a through 2d, 3a and 3b may be present in any part of device 160'.

An exemplary embodiment of device 160' is an edge-emitting laser which has GaAs for substrate 162', a transition region 188' with κ<0 and comprising (In,Al,Ga)(As,P), and an (In,Al,Ga)P active region 114 which emits light beam 172' at 0.68 μm or shorter wavelength.

Yet another exemplary embodiment of device 160' is an edge-emitting laser which has Si for substrate 162', and a transition region 188' with κ<0. Transition region 188' may comprise cubic InAsN with decreasing As until the lattice constant of cubic InN is reached, after which transition region 188' may continue preferably comprising cubic InGaN, InAlN, or a combination therof. Transition region 188' may also comprise any materials, preferably in the (In,Al,Ga)(As,P,N) system. Active region 111' may comprise cubic InGaN which emits light beam 172' at 0.6 μm or shorter wavelength, for example ~0.53 μm. Device 160' may alternatively be operated as an LED.

Figure 12:
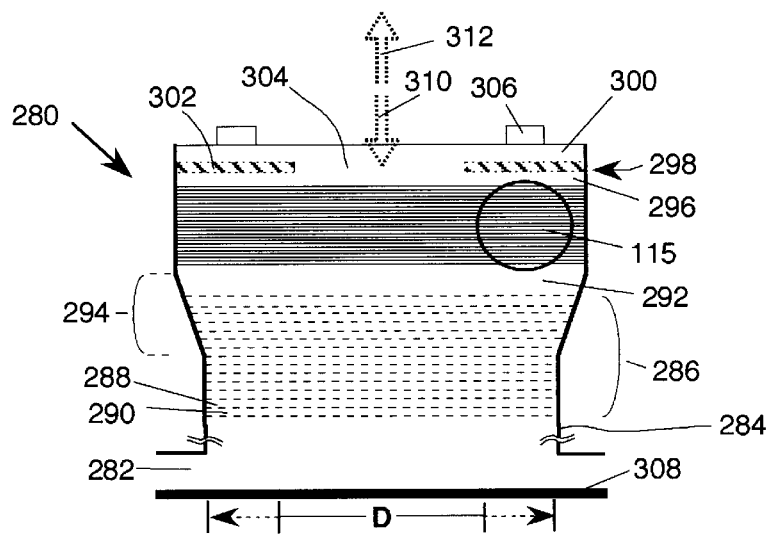
FIG. 12 is a cross section of an alternate embodiment of a VCSEL, LED, photodetector or EOM which incorporates the substrate and transition region of FIGS. 2a through 2d, 3a and 3b, and the active region of FIG. 7.

Turning now to FIG. 12, an alternative device structure is shown which incorporates the inventive concept. Device 280 is preferably a photodetector or EOM, but it may also be a LED. Device 280 may be grown on substrate 282 having a mesa 284. It is to be understood that mesa 284 is a region of selected area growth and may be defined by any of the means discussed previously or by any other means. Bottom mirror 286, if present, comprises high-index layers 288 and low-index layers 290 and is grown on mesa 284. Above mesa 284 or bottom mirror 286 is grown bottom spacer 292. It should be appreciated that mirror 286 may be partially disposed in mesa 284 and/or in transition region 294. As illustrated, transition region 294 is characterized by κ>0, however transition region 294 may alternatively have κ<0. Furthermore, any of the transition regions illustrated in FIGS. 2a through 2d, 3a and 3b may be present in any part of device 280.

The first new lattice constant region 206 may contain active region 115. A detailed discussion of active region 115 is provided above and is illustrated in FIG. 7. If device 280 is a photodetector or EOM, active region 115 may be thicker than corresponding active regions for VCSELs. Above active region 115 are second spacer 296, an optional layer forming optional lens and/or aperture 298 and optional spacer 300. Lens and/or aperture 298 has outer portion(s) 302 which does not conduct current and may be oxidized and an inner channel 304 which conducts current and may be non-oxidized. Optional lens and/or aperture 298 may also be formed, for example, by ion implantation, in which case outer segments 302 may correspond to the implanted regions. Bottom mirror 286 may preferably comprise alternating semiconductor layers such as GaAs or AlGaAs for layers 288 and AlAs or AlGaAs for layers 290. If substrate 282 comprises InP, bottom mirror 286 may preferably comprise alternating semiconductor and oxidized layers, such as InGaAs or InP for layers 288 and an oxide for layers 290. Finally, top and bottom electrical contacts 306, 308 are disposed on respective surfaces of spacer 300 and substrate 282. Additionally, optional isolation regions (not shown) may be provided which may be formed by ion implantation. If device 280 is a photodetector or EOM, incident beam 310 is incident preferably in through the top, for example through spacer 300. Alternatively, incident beam 310 may be incident through the bottom, for example through substrate 282. If device 280 is a light emitter such as a LED, light beam 312 emits preferably out the top, for example through spacer 300. Alternatively, light beam 312 may emit out the bottom, for example through substrate 282.

A preferred embodiment of device 280 is a photodetector which has GaAs for substrate 282, GaAs/AlAs layers for bottom mirror 286, a transition region 294 with κ>0 and comprising InGaAs, and an InGaAs active region 115 which absorbs light beam 310 at 1.3 μm or longer wavelength.

Figure 13:
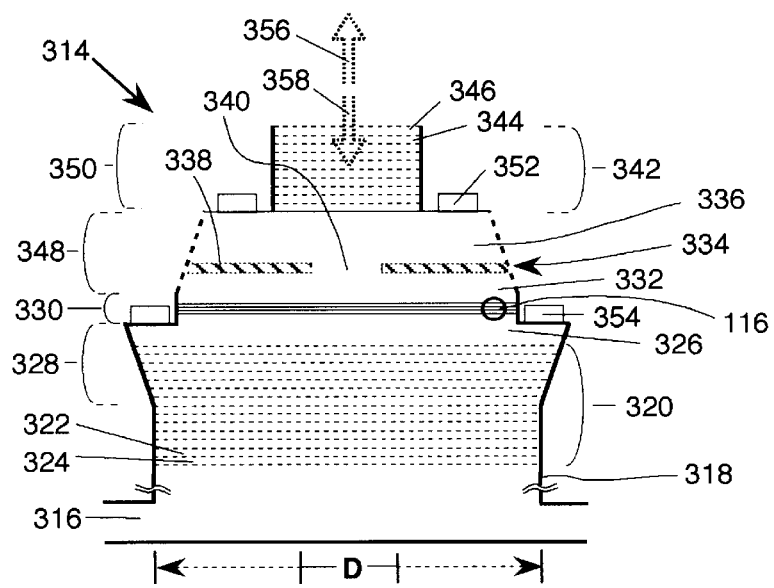
FIG. 13 is a cross section of an alternate embodiment of a VCSEL, LED, photodetector or EOM which incorporates the substrate and transition region of FIGS. 2a through 2d, 3a and 3b, and the active region of FIG. 7.

Turning now to FIG. 13, an alternative device structure is shown which incorporates the inventive concept. Device 314 is preferably a VCSEL, but it may also be a LED, photodetector or EOM. Device 314 may be grown on substrate 316 having a mesa 318. It is to be understood that mesa 318 is a region of selected area growth and may be defined by any of the means discussed previously or by any other means. Bottom mirror 320, if present, comprises high-index layers 322 and low-index layers 324 and is grown on mesa 318. Above mesa 318 or bottom mirror 320 is grown bottom spacer 326. It should be appreciated that mirror 320 may be partially disposed in mesa 318 and/or in transition region 328. As illustrated, transition region 328 is characterized by κ>0 however transition region 328 may alternatively have κ<0. Furthermore, any of the transition regions illustrated in FIGS. 2a through 2d, 3a and 3b may be present in any part of device 314.

The first new lattice constant region 330 may contain active region 116. A detailed discussion of active region 116 is provided above and is illustrated in FIG. 7. Above active region 116 are second spacer 332, an optional layer forming a lens and/or aperture 334 and optional spacer 336. Lens and/or aperture 334 has outer portion(s) 338 which does not conduct current and may be oxidized and an inner channel 340 which conducts current and may be non-oxidized. Lens and/or aperture 334 may also be formed, for example, by ion implantation, in which case outer segments 338 may correspond to the implanted regions. Above lens and/or aperture 334 may be a top mirror 342 comprising low-index layers 344 and high-index layers 346. Optional second transition region 348 may produce a second change in grown lattice constant. Optional top mirror 342 may be epitaxially grown in optional second new lattice constant region 350. Bottom mirror 320 may preferably comprise alternating semiconductor layers such as GaAs or AlGaAs for layers 322 and AlAs or AlGaAs for layers 324. If substrate 316 comprises InP, bottom mirror 320 may preferably comprise alternating semiconductor and oxidized layers, such as InGaAs or InP for layers 322 and an oxide for layers 324. Top mirror 342 may comprise similar materials as bottom mirror 320, or may alternatively comprise dielectric materials. Finally, top and bottom electrical contacts 352, 354 are disposed in communication with spacer 336 and spacer 326. As illustrated, bottom mirror 320 and top mirror 342, if present, do not need to be conductive to electrical current. Additionally, optional isolation regions (not shown) may be provided which may be formed by ion implantation. If device 314 is a light emitter such as a VCSEL or LED, light beam 356 emits preferably out the top, for example through top mirror 342. Alternatively, light beam 356 may emit out the bottom, for example through substrate 316. If device 314 is a photodetector or EOM, incident beam 358 is incident preferably in through the top, for example through top mirror 342. Alternatively, incident beam 358 may be incident through the bottom, for example through substrate 316.

A preferred embodiment of device 314 is a VCSEL which has GaAs for substrate 316, GaAs/AlAs layers for bottom mirror 320, a transition region 328 with κ>0 and comprising InGaAs, an InGaAs active region 116 which emits light beam 356 at 1.3 μm or longer wavelength, and a top mirror 342 comprising GaAs and oxidized AlGaAs layers.

Another preferred embodiment of device 314 is a surface-emitting LED or VCSEL which has SiC or $Al_2O_3$ for substrate 316, and a transition region 328 with κ>0. Transition region 328 may comprise BAlN with decreasing B until the lattice constant of AlN is reached, after which transition region 328 preferably comprises AlGaN, InAlN, or a combination therof. Active region 116 may comprise InGaN which emits light beam 356 at 0.6 μm or shorter wavelength, for example ~0.46 μm. If device 314 is a VCSEL, mirror 320 may preferably comprise alternating layers of InAlN and InAlGaN. Mirror 342 may comprise similarly alternating layers of InAlN and InAlGaN, or it may comprise dielectric layers.

Still another preferred embodiment of device 314 is a surface-emitting LED or VCSEL which has Si for substrate 316, and a transition region 328 with κ<0. Transition region 328 may comprise cubic InAsN with decreasing As until the lattice constant of cubic InN is reached, after which transition region 328 preferably comprises cubic InGaN, InAlN, or a combination therof. Transition region 328 may also comprise any materials, preferably in the (In,Al,Ga)(As,P,N) system. Active region 116 may comprise cubic InGaN which emits light beam 356 at 0.6 μm or shorter wavelength, for example ~0.53 μm. If device 314 is a VCSEL, mirror 320 may preferably comprise alternating layers of cubic InAlN and InAlGaN, or of AlP and AlGaP. Mirror 342 may comprise similarly alternating layers of InAlN/InAlGaN, or AlP/AlGaP, or it may comprise dielectric layers. If mirror 320 comprises InAlN/InAlGaN, it preferably resides in the upper part of or above transition region 328. If mirror 320 comprises AlP/AlGaP, it preferably resides in the lower part of or below transition region 328, and may furthermore be preceeded by or include an additional transition region which transits from a lattice constant close to that of Si to one close to the average lattice constant of AlP and GaP.

Figure 14:
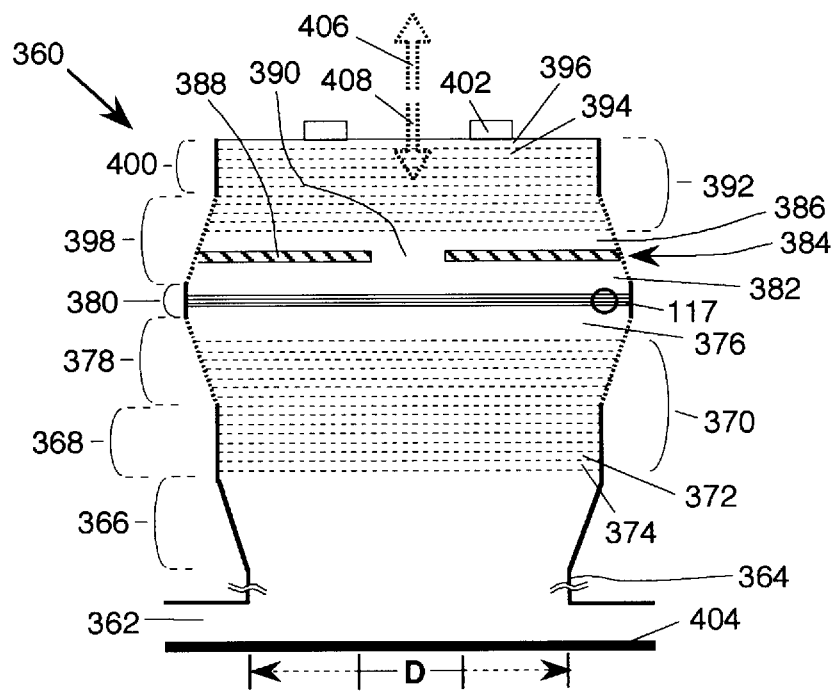
FIG. 14 is a cross section of an alternate embodiment of a VCSEL, LED, photodetector or EOM which incorporates the substrate and transition region of FIGS. 2a through 2d, 3a and 3b, and the active region of FIG. 7.

Turning now to FIG. 14, an alternative device structure is shown which incorporates the inventive concept. Device 360 is preferably a VCSEL, but it may also be a LED, photodetector or EOM. Device 360 may be grown on substrate 362 having a mesa 364. It is to be understood that mesa 364 is a region of selected area growth and may be defined by any of the means discussed previously or by any other means. First transition region 366 produces a change in the grown lattice constant, for example to first new lattice constant region 368. As illustrated, transition region 366 is characterized by κ>0 however transition region 366 may alternatively have κ<0. Bottom mirror 370, if present, comprises high-index layers 372 and low-index layers 374 and is preferably grown above first transition region 366. Above first new lattice constant region 368 or bottom mirror 370 is grown bottom spacer 376. It should be appreciated that mirror 370 may be partially disposed in first new lattice constant region 368 and/or in optional second transition region 378. As illustrated, second transition region 378 is characterized by κ>0 however transition region 378 may alternatively have κ<0. Furthermore, any of the transition regions illustrated in FIGS. 2a through 2d, 3a and 3b may be present in any part of device 360.

Region 380 may be a second new lattice constant region and may contain active region 117. A detailed discussion of active region 117 is provided above and is illustrated in FIG. 7. Above active region 117 are second spacer 382, a layer forming a lens and/or aperture 384 and optional spacer 386. Lens and/or aperture 384 has outer portion(s) 388 which does not conduct current and may be oxidized and an inner channel 390 which conducts current and may be non-oxidized. Lens and/or aperture 384 may also be formed, for example, by ion implantation, in which case outer portions 388 may correspond to the implanted regions. On top of lens and/or aperture 384 may be a top mirror 392 comprising low-index layers 394 and high-index layers 396. Device 360 may have optional transition region 398 and furthermore may have optional new lattice constant region 400. In a preferred embodiment, optional new lattice constant region 400 as a lattice constant close to that of first new lattice constant region 368. Bottom mirror 370 may preferably comprise alternating semiconductor layers such as GaAs or AlGaAs for layers 372 and AlAs or AlGaAs for layers 374. Top mirror 392 may comprise similar materials as bottom mirror 370, or may alternatively comprise dielectric materials. Finally, top and bottom electrical contacts 402, 404 are disposed on respective surfaces of top mirror 392 and substrate 362. If top mirror 392 is not present, top electrical contact 402 is preferably disposed on spacer 386. As illustrated, top mirror 392, if present, should be conductive to electrical current. Alternatively, top mirror 392 may be non-conductive, in which case electrical contact 402 should be disposed below top mirror 392. Additionally, optional isolation regions (not shown) may be provided which may be formed by ion implantation. If device 360 is a light emitter such as a VCSEL or LED, light beam 406 emits preferably out the top, for example through top mirror 392. Alternatively, light beam 406 may emit out the bottom, for example through substrate 362. If device 360 is a photodetector or EOM, incident beam 408 is incident preferably in through the top, for example through top mirror 392 and/or through spacer 386. Alternatively, incident beam 408 may be incident through the bottom, for example through substrate 362.

A preferred embodiment of device 360 is a VCSEL which has Si for substrate 362, a transition region 366 with κ>0 and comprising (In,Al,Ga)P, bottom mirror 370 comprising AlGaAs/AlAs layers, a second transition region 378 with κ>0 and comprising InGaAs, an active region 117 comprising InGaAs which emits light beam 406 at 1.3 μm or longer wavelength, a third transition region 398 with κ<0 and comprising InGaAs, and a top mirror 392 comprising GaAs and AlAs.

Figure 15:
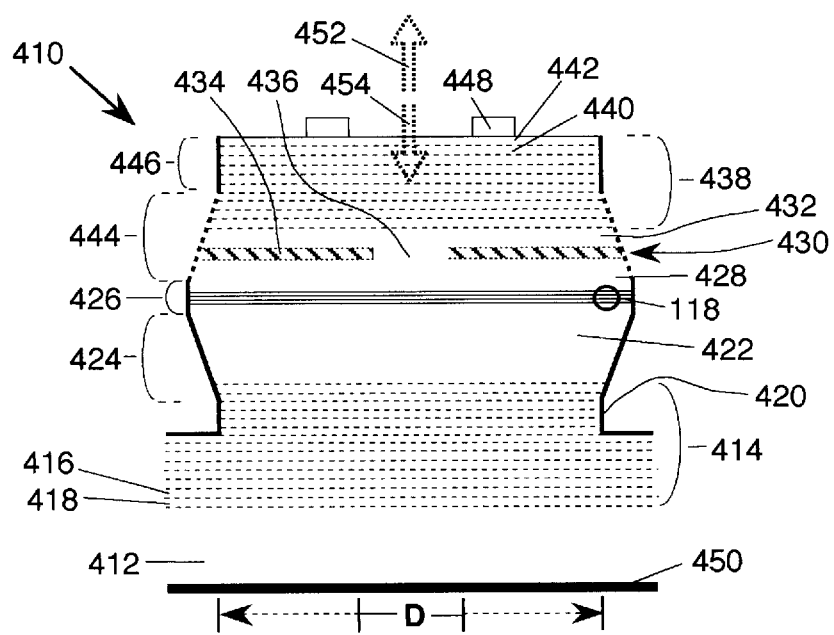
FIG. 15 is a cross section of an alternate embodiment of a VCSEL, LED, photodetector or EOM which incorporates the substrate and transition region of FIGS. 2a through 2d, 3a and 3b, and the active region of FIG. 7.

Turning now to FIG. 15, an alternative device structure is shown which incorporates the inventive concept. Device 410 is preferably a VCSEL, but it may also be a LED, photodetector or EOM. On substrate 412 is grown bottom mirror 414 which comprises high-index layers 416 and low-index layers 418. Above or within mirror 414 is formed mesa 420. It is to be understood that mesa 420 is a region of selected area growth and may be defined by any of the means discussed previously or by any other means. On mesa 420 is grown bottom spacer 422. Bottom spacer 422 may also comprise at least part of mesa 420. It should be appreciated that mirror 414 may be partially disposed in mesa 420 and/or in transition region 424. As illustrated, transition region 424 is characterized by κ>0, however transition region 424 may alternatively have κ<0. Furthermore, any of the transition regions illustrated in FIGS. 2a through 2d, 3a and 3b may be present in any part of device 410.

The first new lattice constant region 426 may contain active region 118. A detailed discussion of active region 118 is provided above and is illustrated in FIG. 7. Above active region 118 are second spacer 428, a layer forming a lens and/or aperture 430 and optional spacer 432. Lens and/or aperture 430 has outer portion(s) 434 which does not conduct current and may be oxidized and an inner channel 436 which conducts current and may be non-oxidized. Lens and/or aperture 430 may also be formed, for example, by ion implantation, in which case outer portions 434 may correspond to the implanted regions. On top of lens and/or aperture 430 may be a top mirror 438 comprising low-index layers 440 and high-index layers 442. Device 410 may have optional second transition region 444 and furthermore may have a second new lattice constant region 446. In a preferred embodiment, second new lattice constant region 446 as a lattice constant close to that of substrate 412. Bottom mirror 414 may preferably comprise alternating semiconductor layers such as GaAs or AlGaAs for layers 416 and AlAs or AlGaAs for layers 418. If substrate 412 comprises InP, bottom mirror 414 may preferably comprise alternating semiconductor and oxidized layers, such as InGaAs or InP for layers 416 and an oxide for layers 418. Top mirror 438 may comprise similar materials as bottom mirror 414, or may alternatively comprise dielectric materials. Finally, top and bottom electrical contacts 448, 450 are disposed on respective surfaces of top mirror 438 and substrate 412. If top mirror 438 is not present, top electrical contact 448 is preferably disposed on spacer 432. As illustrated, top mirror 438, if present, should be conductive to electrical current. Alternatively, top mirror 438 may be non-conductive, in which case electrical contact 448 should be disposed below top mirror 438. Additionally, optional isolation regions (not shown) may be provided which may be formed by ion implantation. If device 410 is a light emitter such as a VCSEL or LED, light beam 452 emits preferably out the top, for example through top mirror 438. Alternatively, light beam 452 may emit out the bottom, for example through substrate 412. If device 410 is a photodetector or EOM, incident beam 454 is incident preferably in through the top, for example through top mirror 438 and/or through spacer 432. Alternatively, incident beam 454 may be incident through the bottom, for example through substrate 412.

A preferred embodiment of device 410 is a VCSEL which has GaAs for substrate 412, bottom mirror 414 comprising GaAs/AlAs layers, mesa 420 formed by dielectric patterning, a transition region 424 with κ>0 and comprising InGaAs, an active region 118 comprising InGaAs which emits light beam 452 at 1.3 μm or longer wavelength, a second transition region 444 with κ<0 and comprising InGaAs, and a top mirror 438 comprising GaAs and AlAs.

Figure 16:
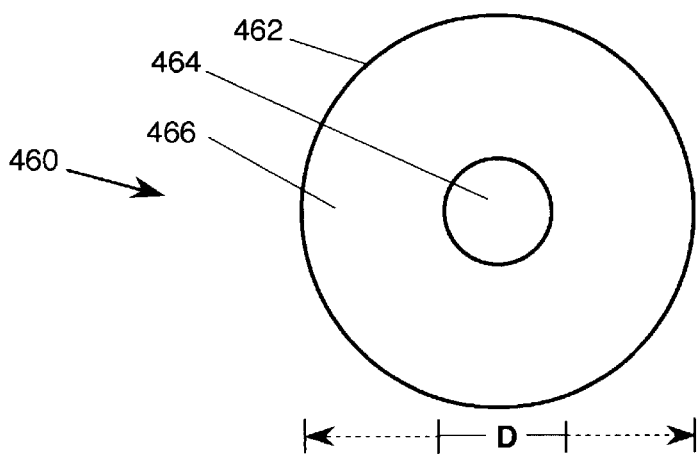
FIG. 16 is a top view of a single device having an active layer constructed in accordance with a preferred embodiment of the invention.

Turning now to FIG. 16, there is illustrated a top view of device 460, which is preferably a VCSEL, although it may alternatively be a LED, photodetector, EOM or other device. Device 460 comprises mesa 462. Device 460 has an active region layer (not labeled) in which central region 464 has an average grown lattice constant which differs from the average grown lattice constant of outer region 466. Preferably, central region 464 has an average grown lattice constant which differs from the substrate lattice constant by a larger amount than does the average grown lattice constant of outer region 466. For example, the substrate (not shown) may be GaAs and central region 464 may comprise InGaAs with a higher In concentration than that of outer region 466 which also comprises InGaAs.

In the epitaxial growth of devices such as VCSELs it is often advantageous to monitor the growth by optical reflectivity or by other means. If the mesas on which the VCSELs or other devices are grown fill only a small fraction of the substrate area, such monitoring may not attain the desired accuracy. It may therefore be preferable to fill the substrate area as much as possible with uniform mesas in order to maximize the effectiveness of such monitoring.

Figure 17:
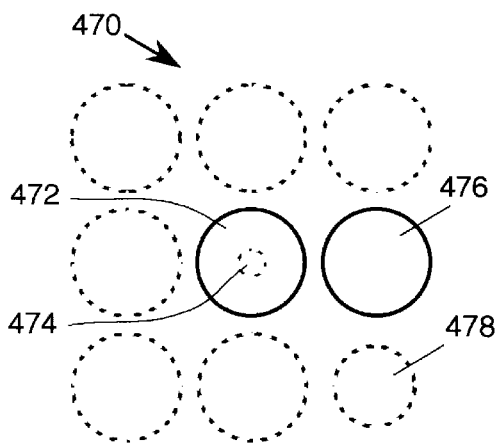
FIG. 17 is a top view of a plurality of devices which are constructed in accordance with a preferred embodiment of the invention.

FIG. 17 shows substrate region 470 containing a plurality of devices such as device 472, which is preferably a VCSEL, although it may alternatively be a LED, photodetector, EOM or other device. Device 472 may comprise an active layer having an a central region 474 which has an average grown lattice constant different from the average grown lattice constant for the entire device area. Substrate region 470 may comprise additional structures such as structure 476. In FIG. 17, device 472 and structure 476 have approximately circular shapes, however they may be of any shape. Structure 476 may have an epitaxial structure similar to that of device 472 however it may be processed and/or packaged differently. For example, structure 476 may be oxidized throughout its entire diameter, or it may not have electrical contacts, or its electrical contacts may not be wirebonded during packaging. Alternatively, structure 476 may be fully fabricated and used for a backup in case device 472 fails. Device 472 and structure 476 may reside on the same chip and/or reside in the same package. Substrate region may also contain additional structure 478 which may be of a different size or shape than device 472. Additional structure 478 may or may not be fully fabricated. For example, device 472 and additional structure 478 may both be VCSELs formed on different size mesas and emit light at different wavelengths.

Figure 18:
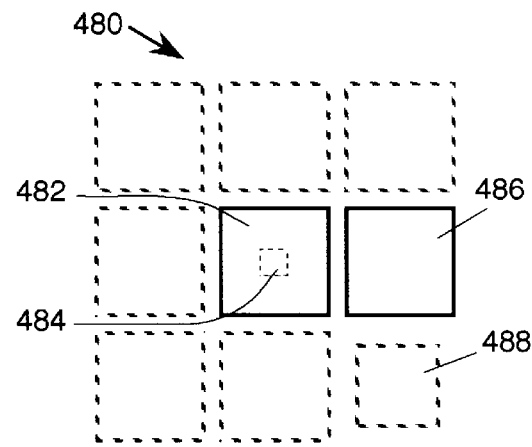
FIG. 18 is a top view of an alternate embodiment of the plurality of devices which are constructed in accordance with a preferred embodiment of the invention.

FIG. 18 shows substrate region 480 containing a plurality of devices such as device 482, which is preferably a VCSEL, although it may alternatively be a LED, photodetector, EOM or other device. Device 482 may comprises an active layer having an a central region 484 which has an average grown lattice constant different from the average grown lattice constant for the entire device area. Substrate region 480 may comprise additional structures such as structure 486. In FIG. 18, device 482 and structure 486 have approximately square shapes, however they may be of any shape. Structure 486 may have an epitaxial structure similar to that of device 482 however it may be processed and/or packaged differently. For example, structure 486 may be oxidized throughout its entire diameter, or it may not have electrical contacts, or its electrical contacts may not be wirebonded during packaging. Alternatively, structure 486 may be fully fabricated and used for a backup in case device 482 fails. Device 482 and structure 486 may reside on the same chip and/or reside in the same package. Substrate region may also contain additional structure 488 which may be of a different size or shape than device 482. Additional structure 488 may or may not be fully fabricated. For example, device 482 and additional structure 488 may both be VCSELs formed on different size mesas and emit light at different wavelengths.

Figure 19:
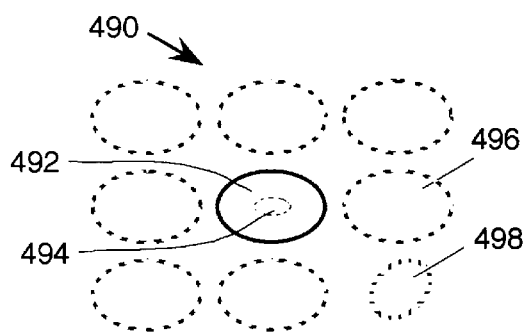
FIG. 19 is a top view of an alternate embodiment of the plurality of devices which are constructed in accordance with a preferred embodiment of the invention.

FIG. 19 shows substrate region 490 containing a plurality of devices such as device 492, which is preferably a VCSEL, although it may alternatively be a LED, photodetector, EOM or other device. Device 492 may comprises an active layer having an a central region 494 which has an average grown lattice constant different from the average grown lattice constant for the entire device area. Substrate region 490 may comprise additional structures such as structure 496. In FIG. 19, device 492 and structure 496 have oval shapes, however they may be of any shape. Having shapes which are not circular or square may produce desirable effects such as controlling the polarization of a VCSEL. Structure 496 may have an epitaxial structure similar to that of device 492 however it may be processed and/or packaged differently. For example, structure 496 may be oxidized throughout its entire diameter, or it may not have electrical contacts, or its electrical contacts may not be wirebonded during packaging. Alternatively, structure 496 may be fully fabricated and used for a backup in case device 492 fails. Device 492 and structure 496 may reside on the same chip and/or reside in the same package. Substrate region may also contain additional structure 498 which may be of a different size or shape than device 492. Additional structure 498 may or may not be fully fabricated. For example, device 492 and additional structure 498 may both be VCSELs formed on different size mesas and emit light at different wavelengths and/or be formed on differently oriented mesas and emit light with different polarizations.

Figure 20:
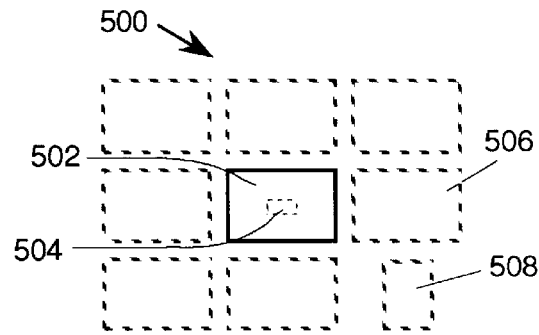
FIG. 20 is a top view of yet another alternate embodiment of the plurality of devices which are constructed in accordance with a preferred embodiment of the invention.

FIG. 20 shows substrate region 500 containing a plurality of devices such as device 502, which is preferably a VCSEL, although it may alternatively be a LED, photodetector, EOM or other device. Device 502 may comprises an active layer having an a central region 504 which has an average grown lattice constant different from the average grown lattice constant for the entire device area. Substrate region 500 may comprise additional structures such as structure 506. In FIG. 20, device 502 and structure 506 have rectangular shapes, however they may be of any shape. Having shapes which are not circular or square may produce desirable effects such as controlling the polarization of a VCSEL. Structure 506 may have an epitaxial structure similar to that of device 502 however it may be processed and/or packaged differently. For example, structure 506 may be oxidized throughout its entire diameter, or it may not have electrical contacts, or its electrical contacts may not be wirebonded during packaging. Alternatively, structure 506 may be fully fabricated and used for a backup in case device 502 fails. Device 502 and structure 506 may reside on the same chip and/or reside in the same package. Substrate region may also contain additional structure 508 which may be of a different size or shape than device 502. Additional structure 508 may or may not be fully fabricated. For example, device 502 and additional structure 508 may both be VCSELs formed on different size mesas and emit light at different wavelengths and/or be formed on differently oriented mesas and emit light with different polarizations.

It should be appreciated that merely two similar examples of in-plane laser structures have been described. These descriptions are merely illustrative and should in no way be viewed as limiting the invention to this particular structure. In-plane lasers within the invention include but are not limited to Fabry-Perot EELs, distributed feedback (DFB) lasers, phase-shifted DFB lasers, distributed Bragg reflector (DBR) lasers, angle-facet surface emitting lasers and grating surface emitting lasers.

It is to be appreciated that under appropriate conditions the RAGG technique may be carried out on relatively large regions, even over full wafers or significant portions thereof. For some applications, for example red-emitting lasers on GaAs substrates, even a small change in lattice constant, e.g., −0.2%, may produce a significant improvement in performance. With the nominal RAGG condition $|\kappa|=1.0$, and on a 2-inch (50 mm) diameter wafer, a 0.2% change in lattice constant uses a transition region 100 $\mu$m thick. Epitaxial films of 100 $\mu$m thickness have been grown, but without any change in lattice constant as reported by Y. Kohama et al. in "0.85 $\mu$m Bottom-Emitting Vertical-Cavity Surface-Emitting Laser Diode Arrays Grown on AlGaAs Substrates," published in Electronics Letters, volume 30, pp. 1406–1407 (1994).

Figure 21:
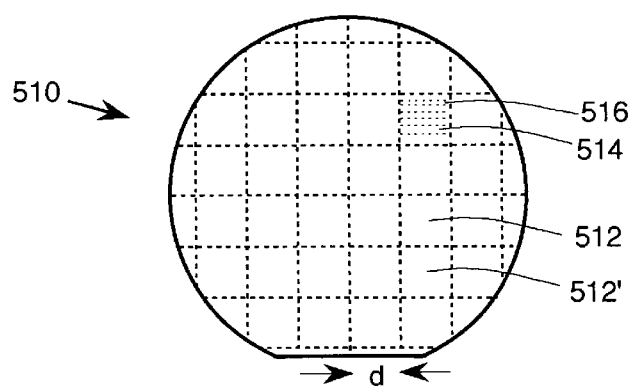
FIG. 21 is a top planar view of a semiconductor wafer constructed in accordance with a preferred embodiment of the invention.

FIG. 21 shows a top planar view of wafer 510. RAGG-based growth may be undertaken on such a full wafer. It may be preferable for wafer 510 to be divided into regions 512 which may be of any dimension d, for example 250 $\mu$m or 1 cm. Such dimensions are generally sufficient for containing one or more edge-emitting lasers or VCSELs. Regions 512 and 512' may or may not be the same size and shape. A given region may also be subdivided into subregions such as subregions 514 and 516. Such subdivision may be desirable for example in the production of edge-emitting lasers on GaAs substrates which emit at wavelengths less than 700 nm or greater than 1000 nm. Such edge-emitting lasers are exemplified in FIGS. 8 and 11. Epitaxial growth on long, narrow regions such as subregions 514 and 516 may produce material superior to growth on wider regions as suggested in the publication by Y. Zou et al. "Photoluminescence Study of Critical Thickness of Pseudomorphic Quantum Wells Grown on Small Area Mesa Stripes," published in Applied Physics Letters, volume 58, pp. 717–719 (1991). In FIG. 21 subregions 514 and 516 are illustrated to be of different widths, which may produce a plurality of lasers emitting at different wavelengths. Since edge-emitting lasers are often fabricated with cleaved facets at either end, it may be preferred for the dimension d of a region 512 or subregion 514 to be larger than eventual length of the laser, D, as illustrated in FIGS. 8 an 11. Advantage may also be taken of variation in material composition over a region 512 or subregion 514. If the grown material has a higher bandgap energy at one or both output facets of the laser, the electrically injected electrons and holes will tend to drift away form the facet. Thus, the usual nonradiative recombination and optical absorption at a facet will be reduced, thereby enhancing the reliability of the laser.

While the above discussion has provided examples of structures utilizing substrates such as SiC, InP, $Al_2O_3$, Si, GaP, and GaAs; and active regions such as (InAlGa)N, (InAlGa)As, and (InAlGa)P, other combinations of substrates with active regions are within the scope of the invention. For example, recent work has been performed on $MgAl_2O_4$ substrates. Thus, any active region grown on any substrate and utilizing the RAGG technique to grow the active region on the substrate would be within the scope of the invention.

Although the present invention has been fully described in conjunction with the preferred embodiment thereof with reference to the accompanying drawings, it is to be understood that various changes and modifications may be apparent to those skilled in the art. For example, may different transition regions or combinations of transition regions may be used. A wide variety of substrate materials and transition region materials may be chosen. Also there are a large number of configurations for electrodes. The complete set of device configurations within the inventive concept is prohibitively large and various changes and modifications may be apparent to those skilled in the art. Such changes and modifications are to be understood as included within the scope of the present invention as defined by the appended claims, unless they depart therefrom.

What is claimed:

1. A semiconductor structure, said semiconductor structure comprising:
   a first layer on a restricted growth surface having a first central region with a transverse dimension D and having a first average lattice constant $L_1$ within said first central region;
   a first, last and at least one intermediate transition layers, said transition layers forming a transition region, said transition region disposed above said first layer, said transition region having a vertical thickness T, and where at least one of said intermediate transition layers has average lattice constants between $L_1$ and a second average lattice constant $L_c$ where said first transition layer has a lattice constant closer to said $L_1$ than $L_c$ and said last transition layer has a lattice constant closer to said $L_c$ than $L_1$; and
   a second layer disposed on said transition region, said second layer having a second average lattice constant $L_2$, said second layer having a second central region having said average lattice constant $L_c$ and an average lattice constant $L_3$ outside of said second central region, and where $L_c$ does not equal $L_3$; wherein:
said transition region has an average fractional change in lattice constant characterized by $\kappa$ where $\kappa=(D/T)\{(L_c-L_1)/L_1\}$, where $|\kappa|<18$ and wherein a lattice mismatch $|L_c-L_1|/L_1 \geq 0.0014$.

2. The semiconductor structure recited in claim 1, wherein $D \geq 2$ $\mu$m.

3. The semiconductor structure recited in claim 1, wherein $L_c$ is greater than $L_3$ for at least one of said transition layers.

4. The semiconductor structure recited in claim 1, wherein $L_c$ is less than $L_3$ for at least one of said transition layers.

5. The semiconductor structure recited in claim 1, wherein a lattice mismatch $|L_c-L_1|/L_1 \geq 0.002$.

6. The semiconductor structure recited in claim 1, wherein a lattice mismatch $|L_c-L_1|/L_1 \geq 0.003$.

7. The semiconductor structure recited in claim 1, wherein $T \geq 30$ Å.

8. The semiconductor structure recited in claim 1, wherein said restricted growth surface is an etched mesa.

9. The semiconductor structure recited in claim 1, wherein said restricted growth surface is an etched recess.

10. The semiconductor structure recited in claim 1, wherein said restricted growth surface is defined by pattern disorienting a portion of said substrate.

11. The semiconductor structure recited in claim 1, wherein said restricted growth surface is defined by growth inhibiting material.

12. The semiconductor structure recited in claim 1, wherein said restricted growth surface is defined by laser assisted growth.

13. The semiconductor structure recited in claim 1, wherein said first layer resides on a substrate having a lateral dimension $L \geq 21$ mm and said transition region characterized by $|\kappa| \leq 7$.

14. The semiconductor structure recited in claim 1, wherein said semiconductor structure has $\leq 10^3$ defects/cm$^2$.

15. The semiconductor structure recited in claim 1, further comprising:
- a light emitting active layer disposed above said at least one intermediate transition layer;
- a first conductive layer having a first conductivity type, said first conductive layer disposed in electrical communication with said light emitting active layer;
- a second conductive layer having a second conductivity type, said second conductive layer being disposed in electrical communication with said light emitting active layer; and
- electrical communication means for providing electrical current to said with said light emitting active layer, thereby forming a light emitting device.

16. The semiconductor structure recited in claim 1, wherein said restricted growth surface is an etched mesa, $\kappa > 0$, and said first layer comprises gallium arsenide.

17. A semiconductor structure, said semiconductor structure comprising:
- a first layer, said first layer having a restricted growth surface having a first central region with a transverse dimension D, said first layer having a first average lattice constant $L_1$ within said first central region;
- a first, last and at least one intermediate transition layers, said transition layers forming a transition region, said transition region disposed above said first layer, said transition region having a vertical thickness T, and where at least one of said intermediate transition layers has average lattice constants between $L_1$ and a second average lattice constant $L_2$ where said first transition layer has a lattice constant closer to said $L_1$ than $L_2$ and said last transition layer has a lattice constant closer to said $L_2$ than $L_1$, at least one of said transition layers having a second central region having an average lattice $L_c$ which is between said $L_1$ and $L_2$ and an average lattice constant $L_3$ outside of said second central region, and where $L_c$ does not equal $L_3$; and
- a second layer disposed on said transition region, said second layer having said second average lattice constant $L_2$; wherein:
said transition region has an average fractional change in lattice constant characterized by $\kappa$ where $\kappa = (D/T)\{(L_c-L_1)/L_1\}$, where $|\kappa|<18$ and wherein a lattice mismatch $|L_c-L_1|/L_1 \geq 0.0014$.

18. A semiconductor structure, said semiconductor structure comprising:
- a first layer, said first layer having a restricted growth surface having a first central region with a transverse dimension D and having a first average lattice constant $L_1$ within said first central region;
- a first, last and at least one intermediate transition layers, said transition layers forming a transition region, said transition region disposed above said first layer, said transition region having a vertical thickness T, and where at least one of said intermediate transition layers has average lattice constants between $L_1$ and a second average lattice constant $L_2$ where said first transition layer has a lattice constant closer to said $L_1$ than $L_2$ and said last transition layer has a lattice constant closer to said $L_2$ than $L_1$; and
- a second layer disposed above said transition region, said second layer having said second average lattice constant $L_2$; wherein:
said transition region has an average fractional change in lattice constant characterized by $\kappa$ where $\kappa = (D/T)\{(L_2-L_1)/L_1\}$, where $-18<\kappa<0$ and wherein a lattice mismatch $|L_2-L_1|/L_1 \geq 0.0014$.

19. The semiconductor structure recited in claim 18, wherein said first layer resides on a substrate having a lateral dimension $L > 45$ mm and said transition region characterized by $|\kappa| < 16$.

20. The semiconductor structure recited in claim 18, wherein said first layer comprises Gallium Arsenide.

21. The semiconductor structure recited in claim 20, wherein said second layer comprises a III–V semiconductor structure where the group V element comprises P and the group III element is selected from the group consisting of In, Al, Ga and any combination thereof, and wherein at least one of said intermediate transition layers comprises a III–V semiconductor structure where the group V element comprises P and the group III element is selected from the group consisting of In, Al, Ga and any combination thereof.

22. The semiconductor structure recited in claim 18, wherein said first layer comprises silicon.

23. The semiconductor structure recited in claim 22, wherein said second layer comprises a III–V semiconductor structure where the group V element comprises N and the group III element is selected from the group consisting of In, Al, Ga, and any combination thereof, and wherein at least one of said intermediate transition layers comprises a III–V semiconductor structure where the group III element is selected from the group consisting of In, Al, Ga and any combination thereof and the group V element is selected from the group consisting of As, P, N and any combination thereof.

24. The semiconductor structure recited in claim 18, wherein said first layer comprises $Al_2O_3$.

25. The semiconductor structure recited in claim 24, wherein said second layer comprises a III–V semiconductor structure where the group V element comprises N and the group III element is selected from the group consisting of In, Al, Ga and any combination thereof, and wherein at least one of said intermediate transition layers comprises a III–V semiconductor structure where the group III element is selected from the group consisting of B, In, Al, Ga and any combination thereof and the group V element is selected from the group consisting of As, P, N and any combination thereof.

26. The semiconductor structure recited in claim 18, wherein said first layer comprises Gallium Phosphide.

27. The semiconductor structure recited in claim 26, wherein said second layer comprises a III–V semiconductor structure where the group V element comprises N and the group III element is selected from the group consisting of In, Al, Ga, and any combination thereof, and wherein at least one of said intermediate transition layers comprises a III–V semiconductor structure where the group III element is selected from the group consisting of In, Al, Ga and any combination thereof and the group V element is selected from the group consisting of As, P, N and any combination thereof.

28. The semiconductor structure recited in claim 18, wherein said first layer comprises Indium Phosphide.

29. The semiconductor structure recited in claim 28, wherein said second layer comprises a III–V semiconductor structure where the group V element comprises As, and the group III element is selected from the group consisting of In, Al, Ga and any combination thereof, and wherein at least one of said intermediate transition layers comprises a III–V semiconductor structure where the group III element is selected from the group consisting of In, Al, Ga and any combination thereof and the group V element comprises at least 50% As.

30. A semiconductor structure, said semiconductor structure comprising:

a first layer, said first layer having a restricted growth surface having a first central region with a transverse dimension D and having a first average lattice constant $L_1$ within said first central region;

a first, last and at least one intermediate transition layers, said transition layers forming a transition region, said transition region disposed above said first layer, said transition region having a vertical thickness T, and where at least one of said intermediate transition layers has average lattice constants between $L_1$ and a second average lattice constant $L_2$ where said first transition layer has a lattice constant closer to said $L_1$ than $L_2$ and said last transition layer has a lattice constant closer to said $L_2$ than $L_1$; and a second layer disposed above said transition region, said second layer having said second average lattice constant $L_2$; wherein:

said transition region has an average fractional change in lattice constant characterized by κ where $κ=(D/T)\{(L_2-L_1)/L_1\}$, where 0<κ<18 wherein a lattice mismatch $|L_2-L_1|/L_1 \geq 0.0014$.

31. The semiconductor structure recited in claim 30, wherein said first layer resides on a substrate having a lateral dimension L>45 mm and said transition region characterized by |κ|<16.

32. The semiconductor structure recited in claim 30, wherein said first layer comprises Silicon Carbide.

33. The semiconductor structure recited in claim 32, wherein said second layer comprises a III–V semiconductor structure where the group V element comprises N and the group III element is selected from the group consisting of In, Al, Ga and any combination thereof, and wherein at least one of said intermediate transition layers comprises a III–V semiconductor structure where the group III element is selected from the group consisting of B, In, Al, Ga and any combination thereof and the group V element comprises at least 50% N.

34. The semiconductor structure recited in claim 30, wherein said first layer comprises Gallium Arsenide.

35. The semiconductor structure recited in claim 34, wherein said second layer comprises a III–V semiconductor structure where the group V element comprises As and the group III element is selected from the group consisting of In, Al, Ga and any combination thereof, and wherein at least one of said intermediate transition layers comprises a III–V semiconductor structure where the group III element is selected from the group consisting of In, Al, Ga and any combination thereof and the group V element comprises at least 50% As.

36. The semiconductor structure recited in claim 30, wherein said first layer comprises $Al_2O_3$.

37. The semiconductor structure recited in claim 36, wherein said second layer comprises a III–V semiconductor structure where the group V element is N and the group III element is selected from the group consisting of In, Al, Ga and any combination thereof, and wherein at least one of said intermediate transition layers comprises a III–V semiconductor structure where the group III element is selected from the group consisting of B, In, Al, Ga and any combination thereof and the group V element is element is selected from the group consisting of As, P, N and any combination thereof.

38. The semiconductor structure recited in claim 30, wherein said first layer comprises Indium Phosphide.

39. The semiconductor structure recited in claim 38, wherein said second layer comprises a III–V semiconductor structure where the group V element comprises is selected from the group consisting of As, Sb, and any combination thereof, and the group III element is selected from the group consisting of In, Al, Ga and any combination thereof, and wherein at least one of said intermediate transition layers comprises a III–V semiconductor structure where the group III element is selected from the group consisting of In, Al, Ga and any combination thereof and the group V element comprises at least 50% As.

* * * * *